United States Patent
Cheng

(10) Patent No.: US 10,340,468 B2
(45) Date of Patent: Jul. 2, 2019

(54) DISPLAY DEVICE

(71) Applicant: Japan Display Inc., Tokyo (JP)

(72) Inventor: Hsiang-Yuan Cheng, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/698,739

(22) Filed: Sep. 8, 2017

(65) Prior Publication Data

US 2018/0108851 A1   Apr. 19, 2018

(30) Foreign Application Priority Data

Oct. 17, 2016   (JP) .................. 2016-203210

(51) Int. Cl.
*H01L 27/32* (2006.01)
*H01L 51/00* (2006.01)
*H01L 51/52* (2006.01)

(52) U.S. Cl.
CPC ...... *H01L 51/0097* (2013.01); *H01L 51/5253* (2013.01); *H01L 27/323* (2013.01); *H01L 27/3276* (2013.01); *H01L 2227/323* (2013.01); *H01L 2227/326* (2013.01); *H01L 2251/5338* (2013.01)

(58) Field of Classification Search
CPC ..... H01L 27/15; H01L 27/153; H01L 27/156; H01L 27/32; H01L 27/3209
See application file for complete search history.

(56) References Cited

U.S. PATENT DOCUMENTS 9,639,121 B2   5/2017   Min et al.
2016/0181346 A1*   6/2016   Kwon ................ H01L 27/3276
257/40

FOREIGN PATENT DOCUMENTS

JP   2015-026055 A   2/2015

* cited by examiner

*Primary Examiner* — Jae Lee
(74) *Attorney, Agent, or Firm* — Michael Best & Friedrich LLP

(57) ABSTRACT

Provided is a display device including a base film and a display-element layer over the base film, the display-element layer having a display region including a plurality of pixels. The base film has a first gap separating the base film into a first region and a second region. The display-element layer possesses an insulating film, and the insulating film extends over the first region and the second region and overlaps with the first gap. The base film may have flexibility.

17 Claims, 27 Drawing Sheets

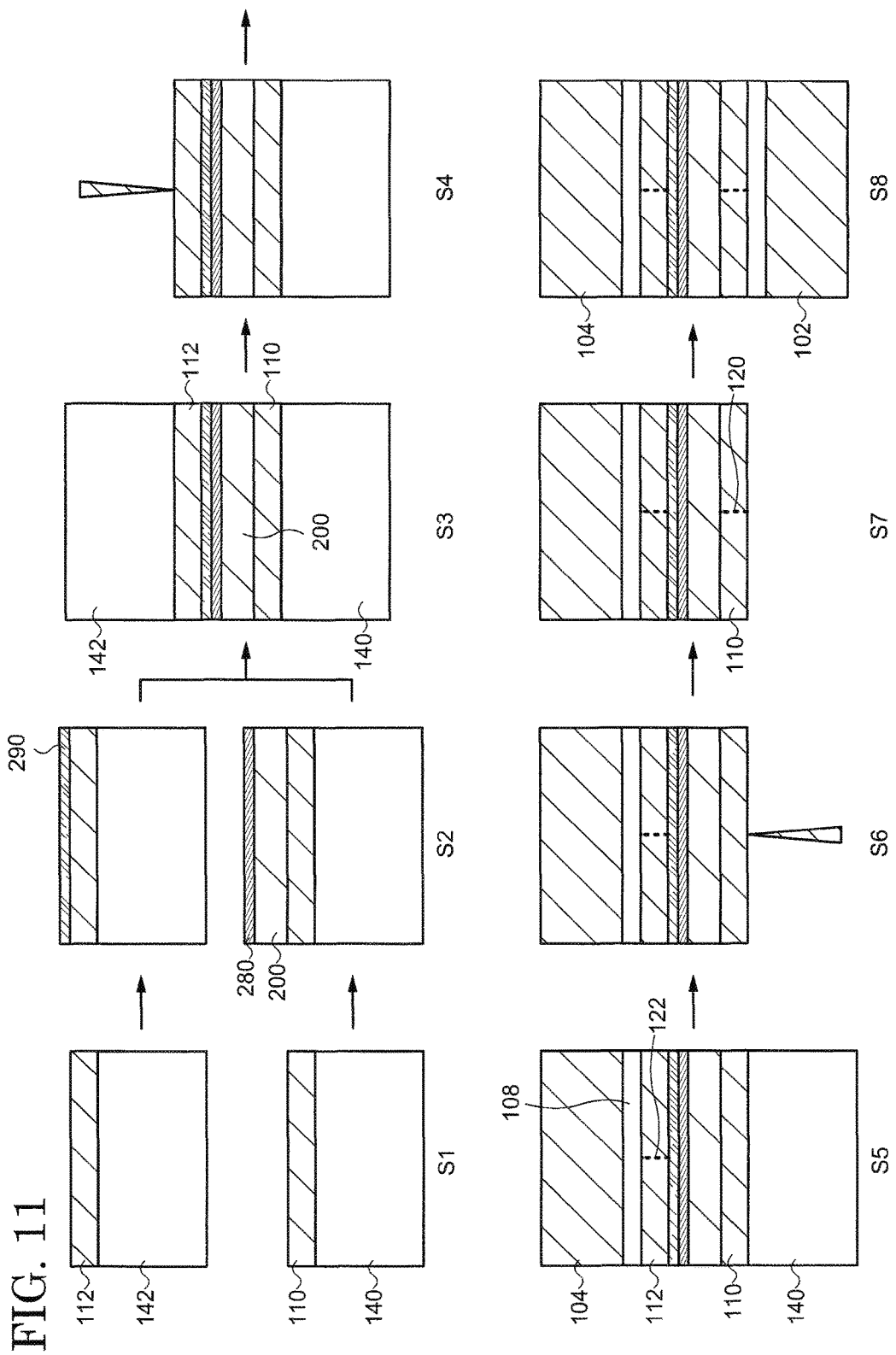

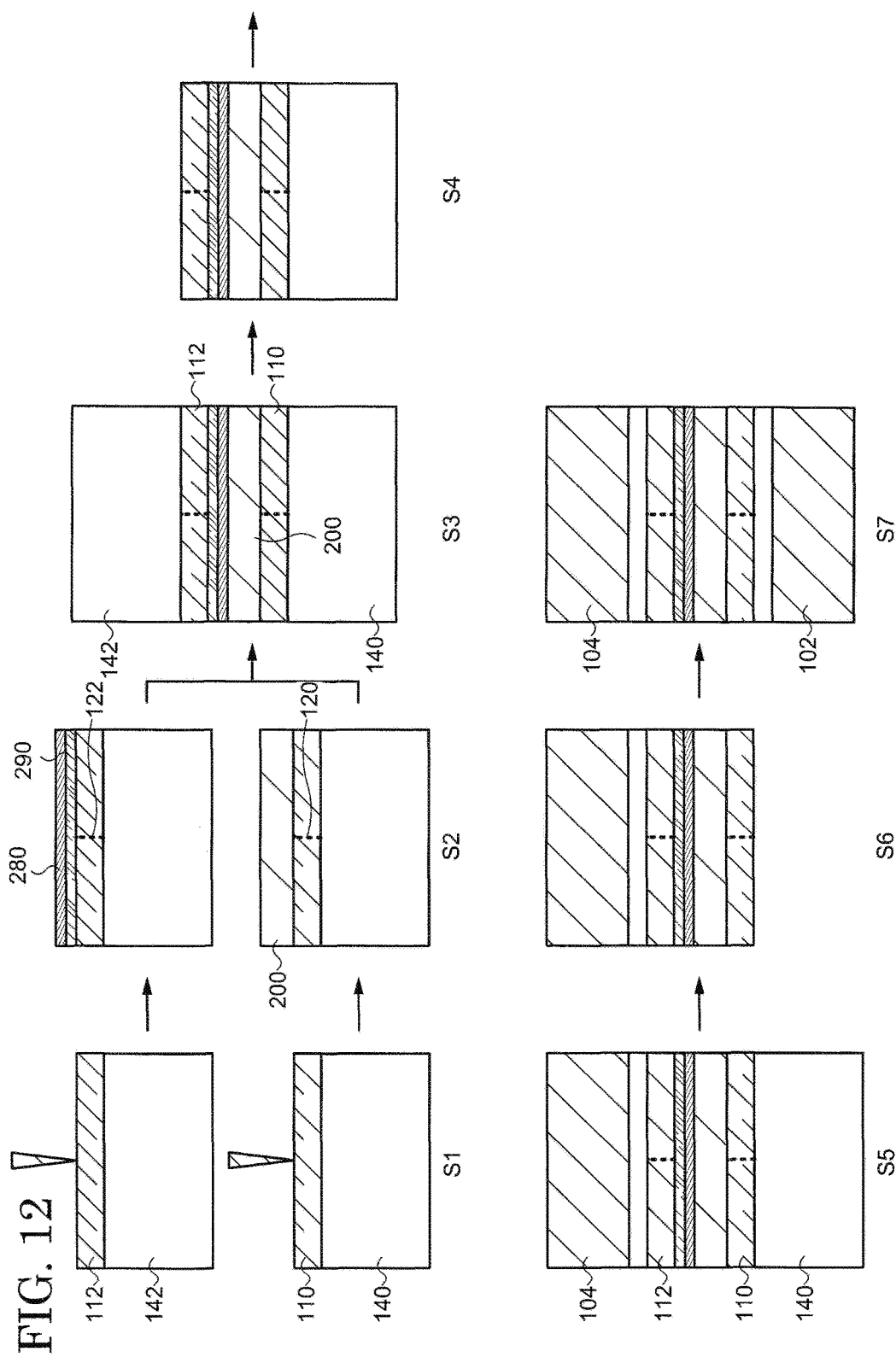

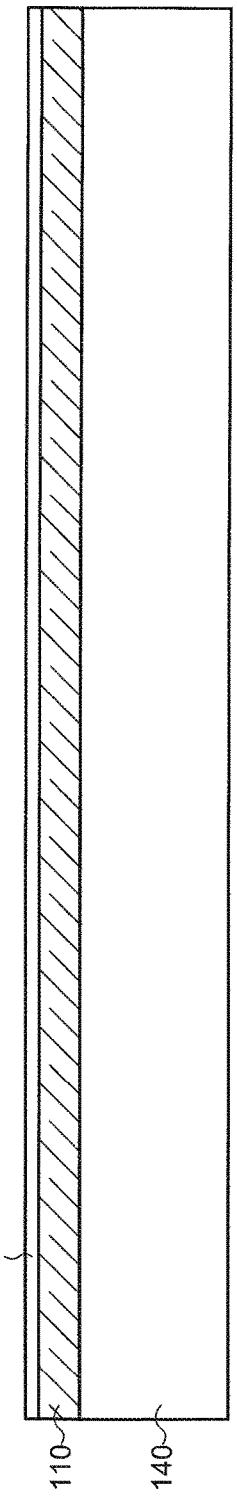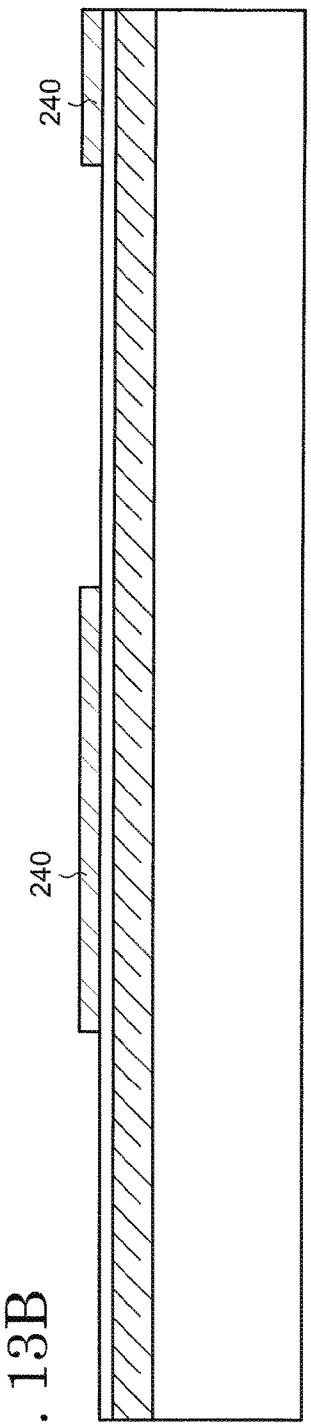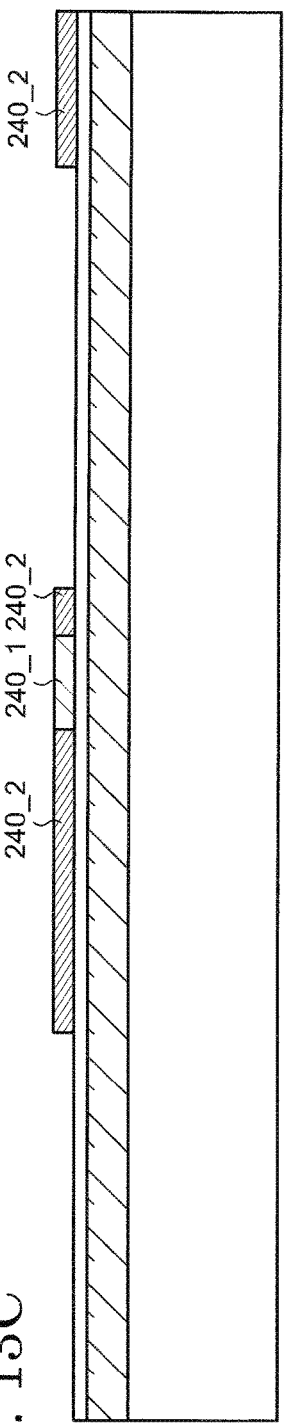

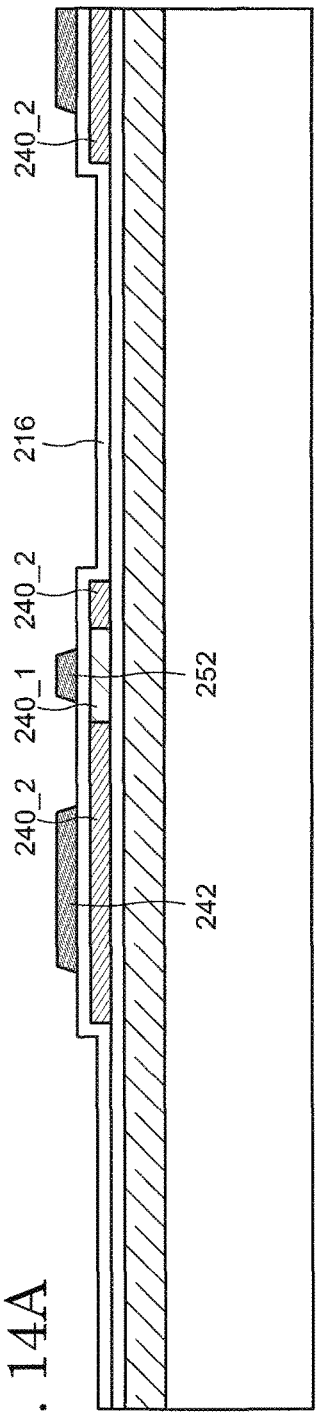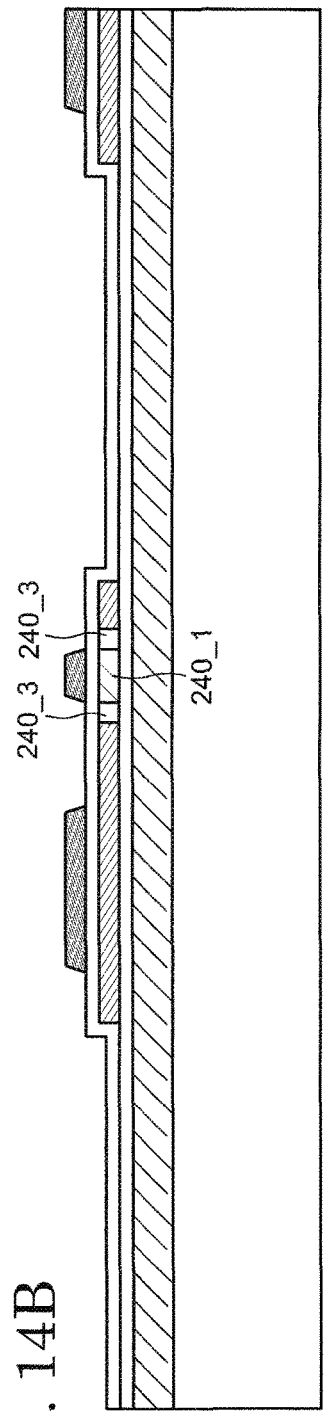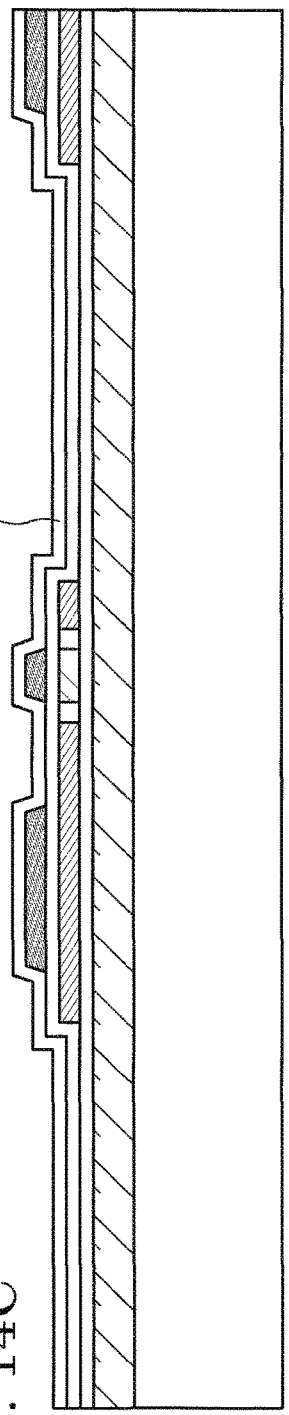

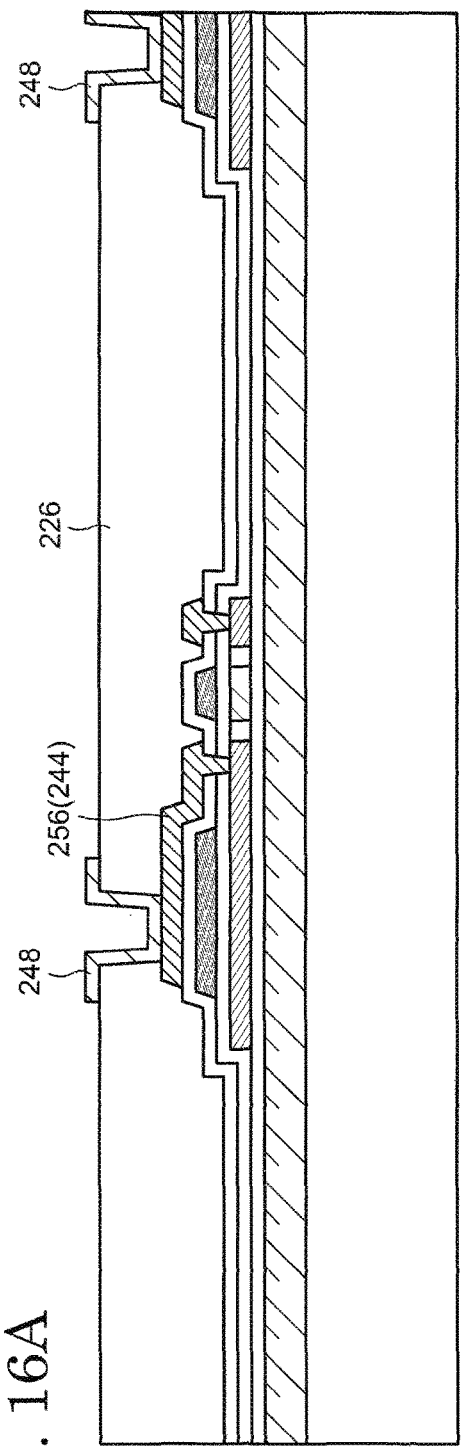
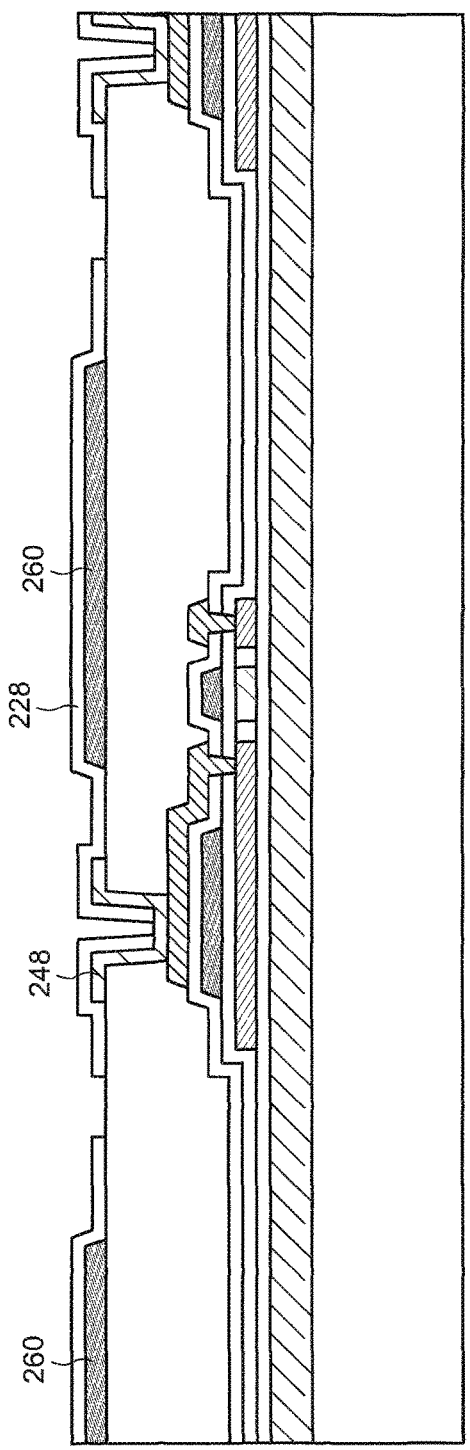

DISPLAY DEVICE

CROSS REFERENCE TO RELATED APPLICATIONS

This application is based on and claims the benefit of priority from the prior Japanese Patent Application No. 2016-203210, filed on Oct. 17, 2016, the entire contents of which are incorporated herein by reference.

FIELD

An embodiment of the present invention relates to a display device such as an organic EL display device and a liquid crystal display device and a manufacturing method thereof. For example, an embodiment of the present invention relates to a flexible display device and a manufacturing method thereof.

BACKGROUND

A liquid crystal display device and an organic EL (Electroluminescence) display device having a liquid crystal element or a light-emitting element in each pixel are represented as a typical example of a display device. These display devices have a liquid crystal element or an organic light-emitting element (hereinafter, referred to as a light-emitting element) in each of a plurality of pixels formed over a substrate. A liquid crystal element and a light-emitting element respectively have a liquid crystal or a layer (hereinafter, referred to as an organic layer or an EL layer) including an organic compound between a pair of electrodes and are operated by applying a voltage or supplying current between the pair of electrodes.

Addition of flexibility to a substrate of such a display device allows production of a flexible display device. A flexible display device is called a sheet display and has attracted much attention as a wearable display device attachable to clothes or a part of a body, for example. For instance, Japanese patent application publication No. 2015-26055 discloses a display device utilizing, as a flexible substrate, a substrate including fibers containing silicon rubber and the like. This display device can be folded due to its flexibility.

SUMMARY

An embodiment of the present invention is a display device. The display device possesses a base film and a display-element layer over the base film, the display-element layer having a display region including a plurality of pixels. The base film has a first gap separating the base film into a first region and a second region. The display-element layer includes an insulating film, and the insulating film extends over the first region and the second region and overlaps with the first gap.

An embodiment of the present invention is a display device. The display device possesses a first base film and a second base film separated from each other, and a display-element layer over the first base film and the second base film, the display-element layer having a display region including a plurality of pixels. The display-element layer has an insulating film, and the insulating film extends over the first base film and the second base film and overlaps with a boundary between the first base film and the second base film.

An embodiment of the present invention is a manufacturing method of a display device. The manufacturing method includes: forming a base film over a first supporting substrate; forming a display-element layer over the base film, the display-element layer having a display region including a plurality of pixels; forming a cap film over a second supporting substrate; bonding the first supporting substrate to the second supporting substrate so that the base film, the display-element layer, and the cap film are sandwiched therebetween; separating the second supporting substrate from the cap film; bonding a second protection sheet to the cap film; separating the first supporting film from the base film; forming a gap in the base film to separate the base film into two parts; and bonding a first protection sheet to the base film.

BRIEF DESCRIPTION OF DRAWINGS

FIG. 11 is a schematic cross-sectional view showing an outline of a manufacturing method of a display device according to an embodiment of the present invention;

FIG. 12 is a schematic cross-sectional view showing an outline of a manufacturing method of a display device according to an embodiment of the present invention;

FIG. 13A to FIG. 13C are schematic cross-sectional views showing a manufacturing method of a display device according to an embodiment of the present invention;

FIG. 14A to FIG. 14C are schematic cross-sectional views showing a manufacturing method of a display device according to an embodiment of the present invention;

FIG. 16A and FIG. 16B are schematic cross-sectional views showing a manufacturing method of a display device according to an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by performing etching or light irradiation on one film, the plurality of films may have functions or rules different from each other. However, the plurality of films originates from a film formed as the same layer in the same process and has the same layer structure and the same material. Therefore, the plurality of films is defined as films existing in the same layer.

In the specification and the scope of the claims, unless specifically stated, when a state is expressed where a structure is arranged "over" another structure, such an expression includes both a case where the substrate is arranged immediately above the "other structure" to be in contact with the "other structure" and a case where the structure is arranged over the "other structure" with an additional structure therebetween.

First Embodiment

1. Structure

In the present embodiment, a structure of a display device 100 according to an embodiment of the present invention is explained.

Figure 1:
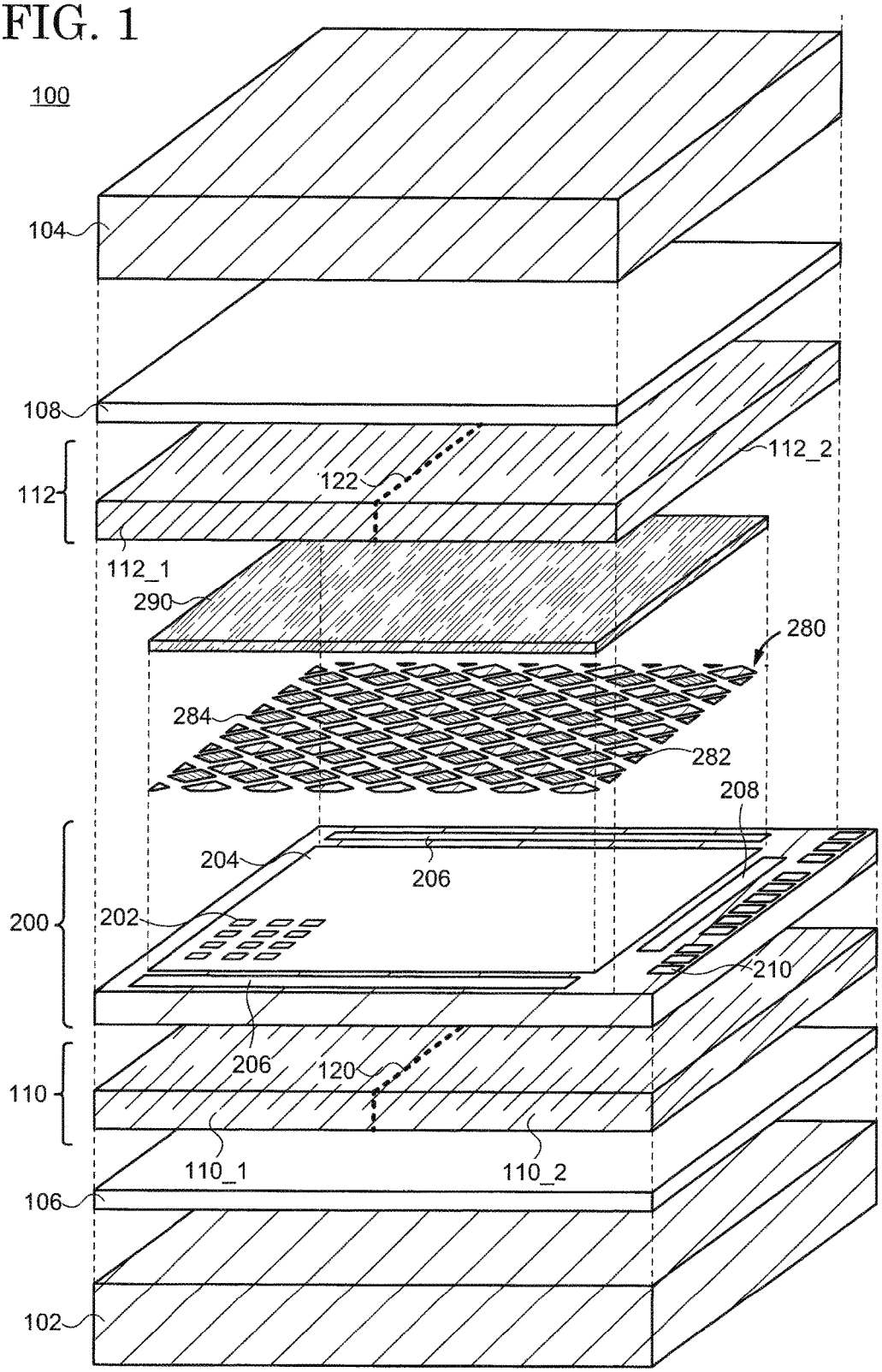
FIG. 1 is a schematic developed view of a display device according to an embodiment of the present invention.

A schematic developed view of the display device 100 is shown in FIG. 1. As shown in FIG. 1, the display device 100 has a display-element layer 200. A base film 110 and a cap film 112 are disposed under and over the display-element layer 200, respectively, and the display-element layer 200 is sandwiched by the base film 110 and the cap film 112. The display device 100 further possesses a first protection sheet 102 and a second protection sheet 104 under the base film 110 and over the cap film 112, respectively. The base film 110, the cap film 112, and the display-element layer 200 are sandwiched by the first protection sheet 102 and the second protection sheet 104.

The display device 100 may possess, as an optional structure, a touch sensor 280 and a polarizing plate 290 between the base film 110 and the cap film 112. FIG. 1 shows a structure where the touch sensor 280 is located between the display-element layer 200 and the polarizing plate 290. However, there is no limitation to a vertical relationship between the touch sensor 280 and the polarizing plate 290, and the polarizing plate 290 may be arranged between the display-element layer 200 and the touch sensor 280. The display device 100 may further include, as an optional structure, adhesion layers 106 and 108 between the base film 110 and the first protection sheet 102 and/or between the cap film 112 and the second protection sheet 104. When the adhesion layers 106 and 108 are not provided, the base film 110 and the first protection sheet 102 can be in contact with each other, and the cap film 112 and the second protection sheet 104 can be in contact with each other.

1-1. Display-Element Layer

The display-element layer 200 has a function to display an image. For example, as shown in FIG. 1, the display-element layer 200 has a plurality of pixels 202 and a display region demarcated by the pixels 202. The display-element layer 200 is provided with driver circuits 206 and 208 supplying a variety of signals to the pixels 202 to control the pixels 202. An example is illustrated in FIG. 1 where two driver circuits 206 are disposed so as to sandwich the display region 204 and the driver circuit 208 is arranged along a side of the display region 204. However, the number and the arrangement of the driver circuits 206 and 208 are not limited. For example, all of or a part of the driver circuits 206 and 208 may be disposed over a connector 212 described below. A driver circuit formed over a semiconductor substrate, such as an IC chip, may be used as the driver circuits 206 and 208.

Wirings not illustrated extend from each pixel 202 and are connected to the driver circuits 206 and 208. Wirings further extend from the driver circuits 206 and 208 toward an edge portion of the display-element layer 200 and are exposed at the edge portion of the display-element layer 200 to form terminals 210. The terminals 210 are connected to a connector 212 such as a flexible printed circuit (FPC), and signals from an external circuit not illustrated are supplied to the driver circuits 206 and 208 through the connector 212 and the terminals 210. The driver circuits 206 and 208 are operated according to these signals and provide signals for displaying an image to the pixels 202.

The plurality of pixels 202 are each provided with a display element such as a light-emitting element and a liquid crystal element and configured so that adjacent pixels 202 give red, green, or blue color. Alternatively, each of the pixels 202 may be configured so that all pixels 202 provide the same color (e.g., white color), and color filters with different absorption properties are arranged in every pixel, by which different colors are extracted between adjacent pixels 202. Arrangement of the pixels 202 is also not limited, and an arbitral arrangement such as a stripe arrangement and a delta arrangement may be employed.

1-2. Touch Sensor

The touch sensor 280 has a function to sense a touch and determine a position thereof when a person's finger or the like touches the touch sensor 280 through the second protection sheet 104 and the cap film 112 formed thereover (hereinafter, this operation is called a touch). The touch sensor 280 overlaps with the display region 204. The touch sensor 208 has a plurality of first touch electrodes 282 and a plurality of second touch electrodes 284. A plurality of columns (lines) of the touch electrodes extending in a first direction is structured by connecting the plurality of first touch electrodes 282. A plurality of lines (columns) of the touch electrodes extending in a second direction intersecting the first direction is structured by connecting the plurality of second touch electrodes 284. One is also called a transmitting electrode (Tx), and the other is called a receiving electrode (Rx). Each of the first touch electrodes 282 is spaced from each of the second touch electrodes 284, and capacitance is generated therebetween. A touch of a person's finger and the like causes a change of the capacitance, and the touch is sensed and the position thereof is determined by reading this change. Thus, the first touch electrodes 282 and the second touch electrodes 284 form the so-called projection-capacitive touch sensor 280.

Wirings not shown extend from the first touch electrodes 282 and the second touch electrodes 284 and are connected to the terminals 210. Signals for driving the touch sensor 280 are provided from the external circuit to the touch sensor 280 through the terminals 210 and the connector 212.

The first touch electrodes 282 and the second touch electrodes 284 each have a plurality of square regions having a substantially square shape (diamond electrode) and connection regions (not illustrated) connecting the adjacent diamond electrodes. The first touch electrodes 282 and the second touch electrodes 284 may exist in the same layer. In this case, over the connection region of one of the first touch electrodes 282 and the second touch electrodes 284, the connection region of the other (bridge electrode) intersects through an interlayer insulating film (described below). Alternatively, the first touch electrodes 282 and the second touch electrodes 284 may exist in different layers with the interlayer insulating film therebetween.

1-3. Polarizing Plate

The polarizing plate has a function to inhibit light incident to the display device 100 from outside and reflected in the display-element layer 200 from being radiated outside from the display device 100. The polarizing plate 290 overlaps with the display region 204. A linear polarizing plate and a circularly polarizing plate may be used as the polarizing plate 290. When a circularly polarizing plate is used as the polarizing plate 290, a stacked structure of a 1/A plate and a linear polarizing plate may be applied.

1-4. Base Film and Cap Film

The base film 110 has a function to support the display-element layer 200, the touch sensor 280, and the polarizing plate 290 and provide physical strength to the display device 100. The base film 110 may have flexibility. In this case, the base film 110 may include a polymer material such as a polyimide, a polyamide, a polyester, and a polycarbonate. Particularly, a polymer material with a relatively high glass-transition temperature or melting point, such as an aromatic polyimide and an aromatic polyamide (aramide), may be used.

The cap film 112 has also a function to support the display-element layer 200 and provide physical strength to the display device 100 and protects the display-element layer 200, the touch sensor 280, and the polarizing plate 290 in association with the base film 110. Similar to the base film 110, the cap film 112 may have flexibility and include a polymer material usable in the base film 110. Note that, when the pixels 202, the driver circuits 206 and 208, and terminals 210 fabricated in the display-element layer 200 are formed over the base film 110 and then the cap film 112 is arranged, a glass-transition temperature or a melting point of the cap film 112 may be lower than that of the base film 110. In the case where an image displayed in the pixels is viewed by a user through the cap film 112, transmittivity of the base film 110 in a visible region may be lower than that of the cap film 112, which permits a color of the base film 110 to be deeper than that of the cap film 112.

A thickness of the base film 110 and a thickness of the cap film 112 may be independently selected and each may be equal to or more than 3 μm and equal to or less than 30 μm, equal to or more than 3 μm and equal to or less than 15 μm, or equal to or more than 3 μm and equal to or less than 10 μm.

At least one of the base film 110 and the cap film 112 may be provided with a cut (hereinafter, referred to as a gap or a slit) 120 or 122 as shown in FIG. 1. As shown in a side view of FIG. 2, the gap 120 may pass from a top surface to a bottom surface of the base film 110. In this case, the gap 120 separates the base film 110 into two regions. In other words, the base film 110 has two base films (first base film 110_1 and second base film 110_2) separated from each other, and a boundary therebetween corresponds to the gap 120. Thus, the boundary is positioned between an edge portion of the first base film 110_1 and an edge portion of the second base film 110_2.

The first base film 110_1 and the second base film 110_2 are independent from each other. Therefore, when the first base film 110 includes a polymer material, there is no or substantially no covalent bond between the first base film 110_1 and the second base film 110_2. However, the first base film 110_1 and the second base film 110_2 may be in physical contact with each other.

Figure 2:
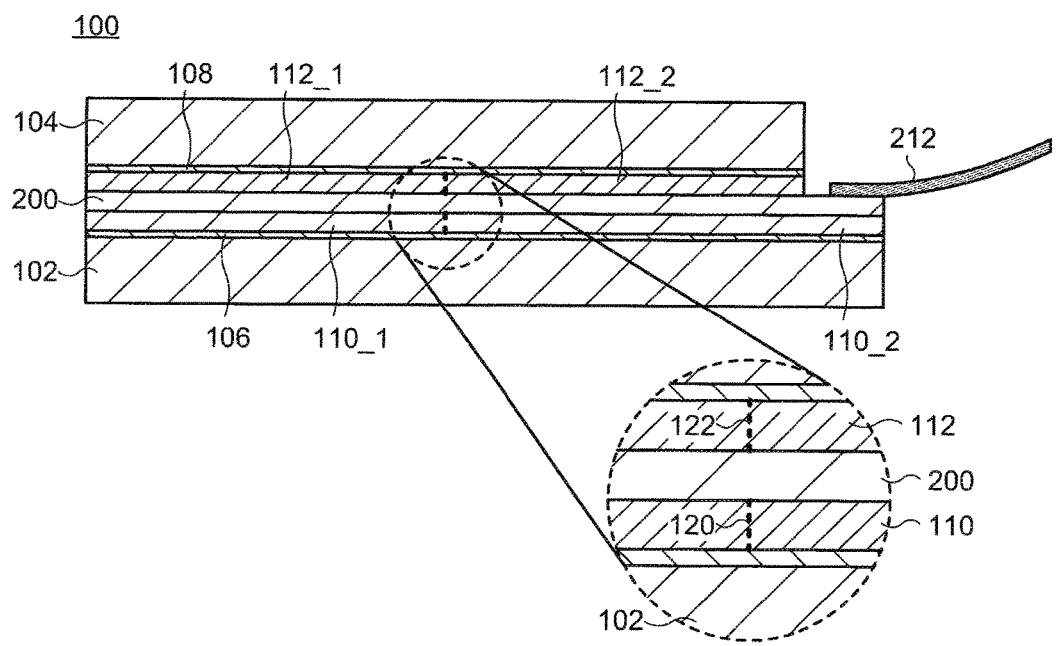
FIG. 2 is a schematic side view of a display device according to an embodiment of the present invention.

Similarly, the gap 122 may pass from a top surface to a bottom surface of the cap film 112 (FIG. 2). In this case, the gap 112 separates the cap film 112 into two regions. As shown in FIG. 1, when one gap 122 is formed in the cap film 112, the cap film 112 has two cap films (first cap film 112_1 and second cap film 112_2) separated from each other, and a boundary therebetween corresponds to the gap 122. Thus, the boundary is positioned between an edge portion of the first cap film 112_1 and an edge portion of the second cap film 112_2.

Similar to the first base film 110_1 and the second base film 110_2, the first cap film 112_1 and the second cap film 112_2 are independent from each other. Therefore, when the first cap film 112 includes a polymer material, there is no or substantially no covalent bond between the first cap film 112_1 and the second cap film 112_2. However, the first cap film 112_1 and the second cap film 112_2 may be in physical contact with each other.

1-5. Adhesion Layer and Protection Sheet

The first protection sheet 102 and the second protection sheet 104 have a function to improve reliability by protecting the display device 100 in addition to a function to provide physical strength to the display device 100. Both or at least one of the first protection sheet 102 and the second protection sheet 104 include a material capable of transmitting visible light. This material may have elasticity, and the first protection sheet 102 and the second protection sheet 104 can include a material which has a high elastic limit and does not readily undergo elastic deformation. The first protection sheet 102 and the second protection sheet 104 may have a higher elastic limit than the base film 110 and the cap film 112. As such a material, a polysiloxane, silicon rubber in which a polysiloxane is cross-linked and the like are represented. In addition to these materials, a polymer such as an acrylonitrile-butadiene-styrene copolymer, a polyurethane, a polybutadiene, a styrene-butadiene copolymer, and a styrene-isoprene copolymer or rubber which is a cross-linked material of these polymers can be used.

The adhesion layers 106 and 108 are an optional structure and have a function to adhere the first protection sheet 102 and the second protection sheet 104 to the base film 110 and the cap film 112, respectively. A variety of adhesives can be used for the adhesion layers 106 and 108, and an epoxy-based adhesive, an acryl-based adhesive, an adhesive based on silicon rubber, an olefin-based adhesive, a urethane-based adhesive, and the like may be used.

The adhesion layers 106 and 108 may be configured to be a pressure-sensitive adhesive.

2. Deformation of Display Device

When a material with flexibility is included in the base film 110 and the cap film 112, the display device 100 can be deformed. In this case, one or both of the gaps 120 and 122 is/are provided to one or both of the base films 110 and the cap film 112, by which the display device 100 can be bent or folded by using the gaps 120 and 122 as a center.

Figure 3A:
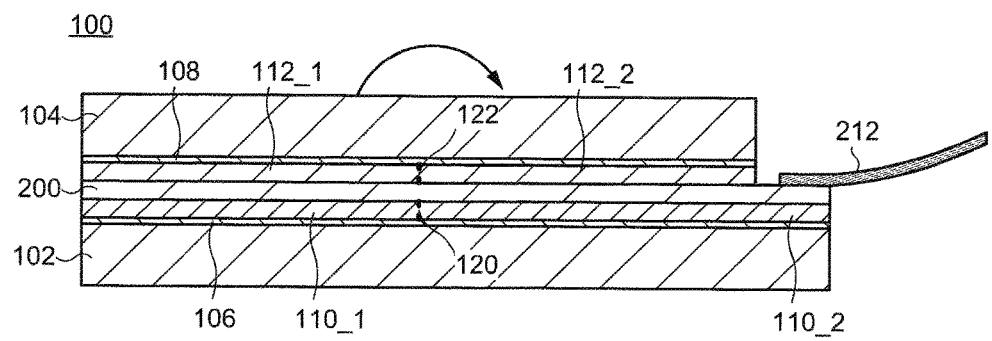
FIG. 3A and FIG. 3B are schematic side views of a display device according to an embodiment of the present invention.
Figure 3B:
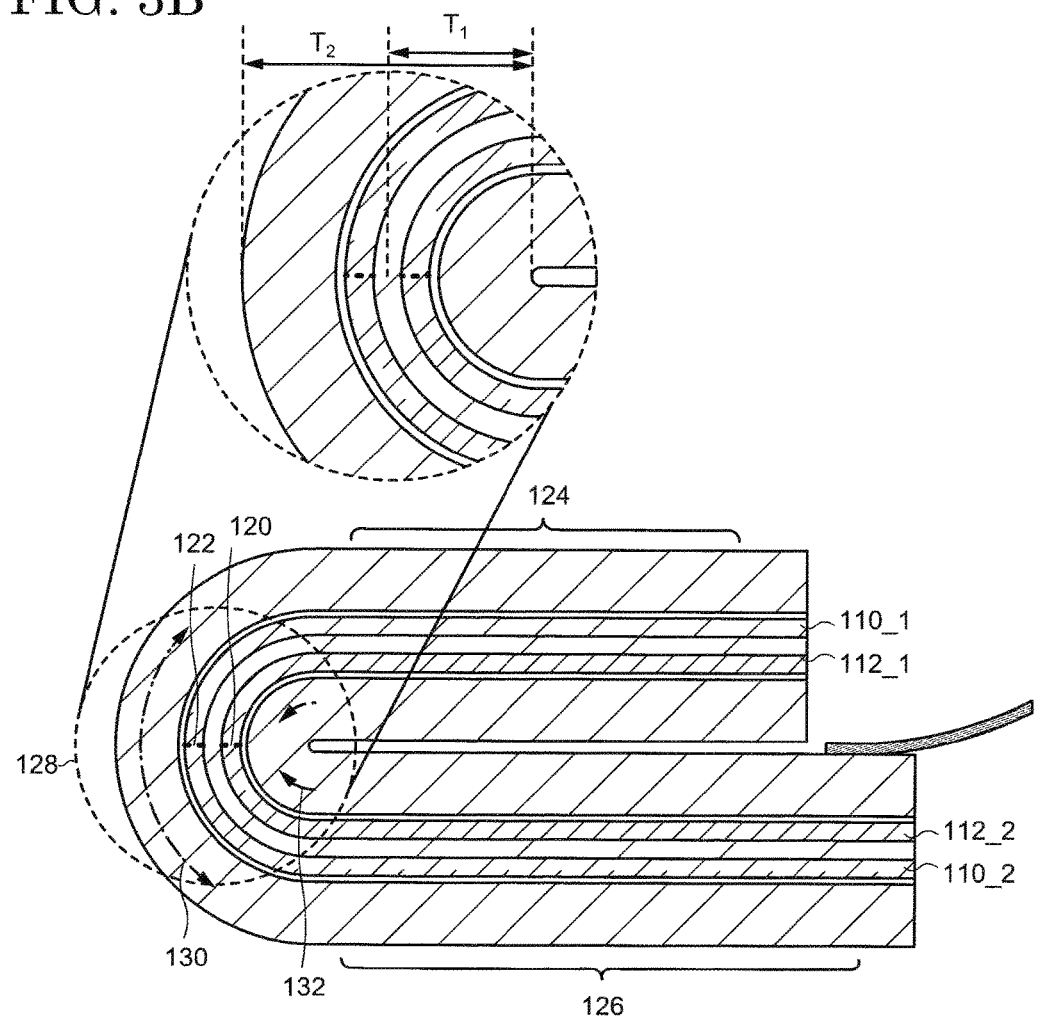

Schematic side views before and after folding the display device 100 are shown in FIG. 3A and FIG. 3B, respectively. In a state where the display device 100 is folded according to an arrow of FIG. 3A, the first base film 110_1 and the second base film 110_2 overlap with each other (FIG. 3B). Similarly, the first cap film 112_1 and the second cap film 112_2 also overlap with each other. The edge portion of the first base film 110_1, the edge portion of the second base film 110_2, the edge portion of the first cap film 112_1, and the edge portion of the second cap film 112_2 are bent to form a bent portion 128. The gaps 120 and 122 are located in the bent portion 128, and the bent portion 128 are sandwiched by flat regions 124 and 126.

When the display device 100 is folded by applying a force from outside (external force), the force shown by arrows 130 and 132 is applied by the bent portion 128. An outer side of the bent portion 128 is tensed, while an inner side thereof is compressed. Therefore, strain is generated and stresses having vectors in opposite directions of the arrows 130 and 132 appear in each layer.

The polymer materials used in the base film 110 and the cap film 112 are compressed or tensed when applied with an external force, leading to deformation. When a magnitude of the external force is equal to or less than an elastic limitation, fracture does not take place. Thus, the strain is released by releasing the force, and the polymer materials return to their original state. However, when the external force exceeds the elastic limitation, fracture occurs, and a crack or turbidity is caused in the polymer material. Thus, the strain remains even if the external force is released, which results in plasticity and inhibits the polymer materials from returning to their original state. Additionally, an attempt to recover the original state results in an adverse influence on the display and causes a decrease in display quality because the shapes of the base film 110 and the cap film 112 irreversibly change due to the residual strain.

However, at least one of the base film 110 and the cap film 112 has the gap 120 or 122 in the display device 100. Therefore, the base film 110 or the cap film 112 is separated into a plurality of regions. Although these regions may be in contact with one another, they can independently undergo deformation. Hence, when the display device 100 is folded, the stress generated in the bent portion 128 is not accumulated in the entire base film 110 or the cap film 112, but dispersed to the separated portions (first base film 110_1, second base film 110_2, first cap film 112_1, and second cap film 112_2), thereby preventing the fracture of the base film 110 and the cap film 112. For example, even when the display device 100 is folded so that a curvature thereof is 1 mm or less, it is possible to prevent fracture of the base film 110 and the cap film 112.

The display device 100 further possesses the first protection sheet 102 and the second protection sheet 104 having a higher elastic limit than the base film 110 and the cap film 112. Hence, the first protection sheet 102 and the second protection sheet 104 have high durability to bending or folding similar to the base film 110 and the cap film 112. Therefore, fracture does not take place and the stress does not remain after deformation even when the display device 100 is deformed.

On the other hand, each layer forming the display-element layer 200 is located at a center of the bent portion 128. That is, each layer is placed at a vicinity of the middle (center line) between the uppermost surface and the lowest surface of the display device 100 in the bent portion ($T_2$ is approximately twice $T_1$ in an enlarged figure of FIG. 3B). Hence, no stress appears or the stress is small in each layer forming the display-element layer 200. Additionally, each layer structuring the display-element layer 200 has an extremely small thickness compared with the base film 110, the cap film 112, the first protection sheet 102, and the second protection sheet 104. Accordingly, influence of the deformation is small and fracture does not readily occur even if the display device 100 is deformed.

Hence, it is possible to prevent fracture of the display device 100 caused by plastic deformation by forming the gap 120 or 122 at least in one of the base film 110 and the cap film 112. Additionally, since the first protection sheet 102 and the second protection sheet 104 have a higher elastic limit than the base film 110 and the cap film 112, these protection sheets are not fractured and do not exhibit plasticity while the display device is deformed even if no gap is formed therein. Accordingly, if the display device 100 is repeatedly subjected to folding processes at a small curvature, the display device 100 is not fractured and display quality can be maintained. That is, a display device with high reliability can be produced.

3. Gap 3-1. Cross-Sectional Shape

There is no limitation to the shape of the gaps 120 and 122, and an arbitral shape can be employed. Since the cross-sectional shapes of the gaps 120 and 122 are a linear line in the example shown in FIG. 1 to FIG. 3B, side surfaces of the first base film 110_1 and the second base film 110_2 are perpendicular to the top surface and the bottom surface of the base film 110. Similarly, side surfaces of the first cap film 112_1 and the second cap film 112_2 are also perpendicular to the top surface and the bottom surface of the cap film 112.

Figure 4A:
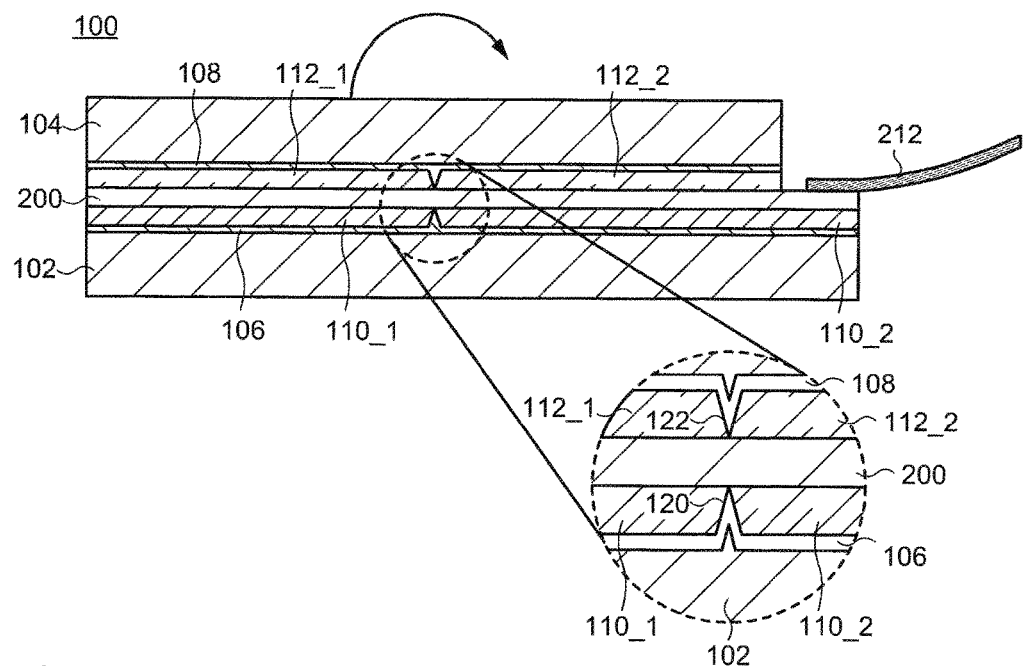
FIG. 4A and FIG. 4B are schematic side views of a display device according to an embodiment of the present invention.

In contrast, as shown in FIG. 4A, the gap 120 may have a V-shaped cross-sectional shape. In this case, the side surface of the first base film 110_1 and the side surface of the second base film 110_2 are inclined from the top surface and the bottom surface of the base film 110. The first base film 110_1 and the second base film 110_2 are spaced from each other at an interface in contact with the adhesion layer 106 (at an interface with the first protection sheet 102 in the case where the adhesive layer 106 is not provided) other than at an interface with the display-element layer 200. Therefore, the adhesive layer 106 (the interface with the first protection sheet 102 in the case where the adhesive layer 106 is not provided) is able to exist between the side surface of the first base film 110_1 and the side surface of the second base film 110_2. In this case, as shown in FIG. 4A, the first protection sheet 102 and the adhesive layer 106 may form a projected portion at a position overlapping with the gap 120.

Similarly, the gap 122 may have a V-shaped cross-sectional shape. In this case, the side surface of the first cap film 112_1 and the side surface of the second cap film 112_2 are inclined from the top surface and the bottom surface of the cap film 112. The first cap film 112_1 and the second cap film 112_2 are spaced from each other at an interface in contact with the adhesion layer 108 (at an interface with the second protection sheet 104 in the case where the adhesive layer 108 is not provided) other than at an interface with the display-element layer 200. Therefore, the adhesive layer 108 (the interface with the second protection sheet 104 in the case where the adhesive layer 108 is not provided) is able to exist between the side surface of the first cap film 112_1 and the side surface of the second cap film 112_2. In this case, as shown in FIG. 4A, the second protection sheet 104 and the adhesive layer 108 may form a projected portion at a position overlapping with the gap 122.

Figure 4B:
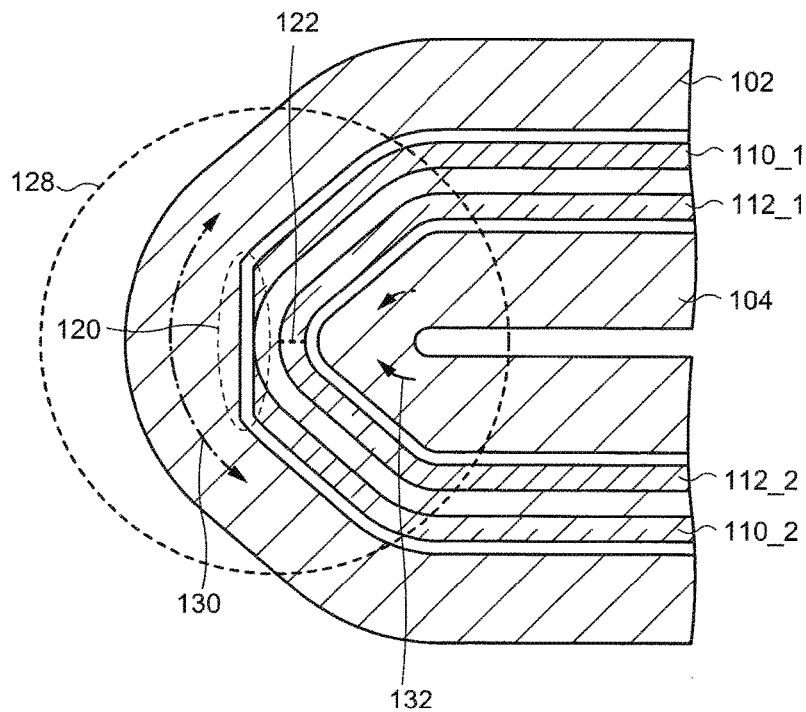

When the display device with such a structure is folded according to an arrow of FIG. 4A, a width of the gap 120 of the base film 110 is expanded in the bent portion 128, and the first protection sheet 102 is stretched in this expanded portion as shown in FIG. 4B. Therefore, the stress in the base film 110 can be relieved. Additionally, since the first protection sheet 102 has higher elasticity than the base film 110, the first protection sheet 102 does not exhibit plasticity and is not fractured if a tensile stress is applied in the expanded portion.

In contrast, a width of the gap 122 of the cap film 112 is narrowed. In this case, although the first cap film 112_1 and the second cap film 112_2 may make contact with each other, they are not fractured because they are not compressed by each other with a strong force. Although the second protection sheet 104 is compressed by the external force, the protection sheet 104 does not exhibit plasticity and is not fractured even if a compression stress is applied because it has a higher elastic limit than the cap film 112.

Accordingly, it is possible to improve durability of the display device 100 to deformation, by which a display device with high reliability can be produced.

Although not shown, the cross-sectional shapes of the gap 120 and 122 are not limited to the V-shape and may be a U-shape or another shape. In such a case, at least one of the side surface of the first base film 110_1, the side surface of the second base film 110_2, the side surface of the first cap film 112_1, and the side surface of the second cap film 112_2 has a bent shape.

3-2. Layout

A plane layout and the number of the gaps 120 and 122 are also not limited, and they can be designed in view of the place where the display device 100 is bent or folded or the properties (i.e., a position which is readily bent) of the base film 110 and the cap film 112. For example, as shown in FIG. 1, the base film 110 and the cap film 112 each may have one gap 120 and one gap 122, respectively. When the base film 110 and the cap film 112 both possess the gaps 120 and 122, respectively, these gaps may overlap with each other or may be arranged parallel to each other. Alternatively, the gaps 120 and 122 may interest each other.

Figure 5A:
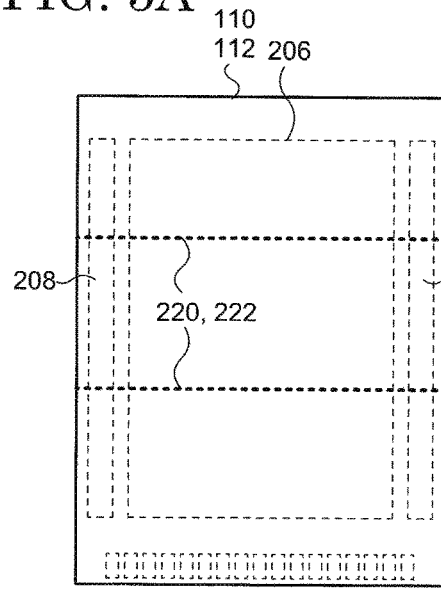
FIG. 5A to FIG. 5D are schematic top views of a display device according to an embodiment of the present invention.

Alternatively, as shown in FIG. 5A, the base film 110 and the cap film 112 may each have a plurality of gaps 120 and 122, respectively. In this case, the numbers of the gaps 120 and 122 may be different and one of the numbers may be one.

Figure 5B:
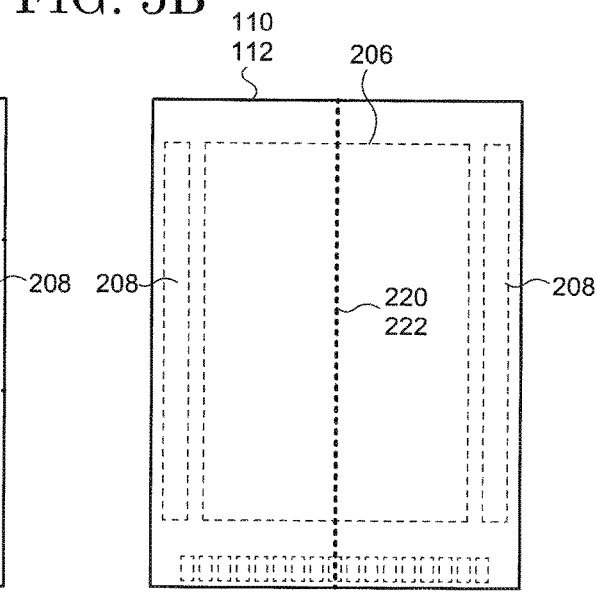
Figure 5C:
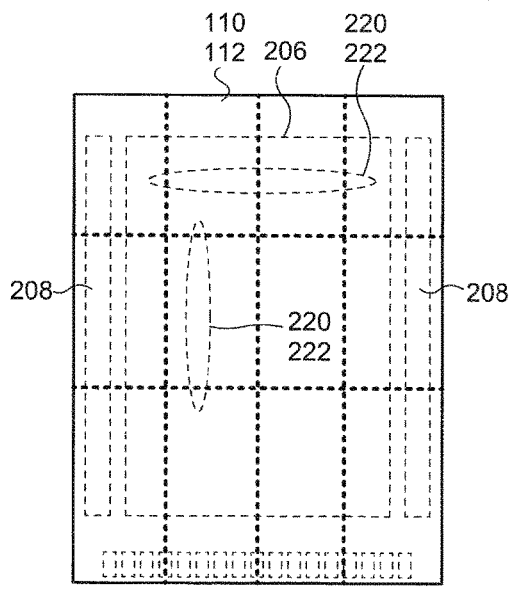

Alternatively, as shown in FIG. 5B, the gaps 120 and 122 may be arranged so as to extend in a direction parallel to a long side of the display region 204. Similarly, as shown in FIG. 5C, the display device 100 may have the gaps 120 and 122 parallel to the long side of the display region 204 as well as the gaps 120 and 122 perpendicular thereto. Although not shown, the gaps 120 and 122 may be inclined from the long side and the short side of the display region 204. Additionally, the display device 100 may have a plane layout where each of the gaps 120 and 122 is structured with a plurality of straight lines. Alternatively, the display device 100 may have a plane layout where the gaps 120 and 122 each have a curve.

Figure 5D:
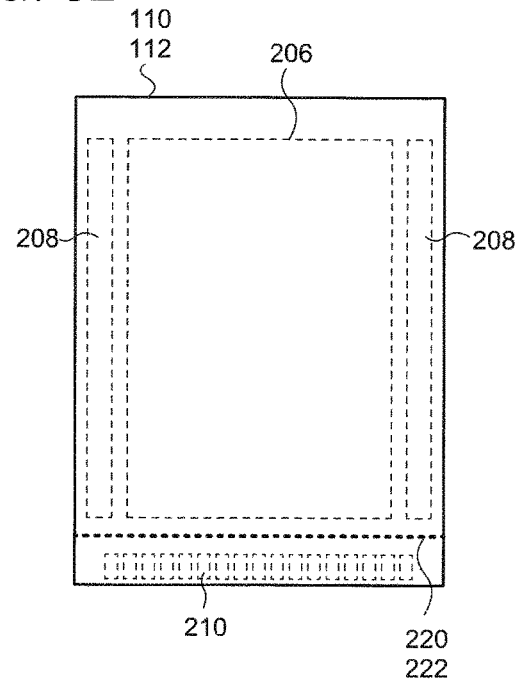

Alternatively, as shown in FIG. 5D, it is not necessary that the gaps 120 and 122 overlap with the display region 204 and may be provided between the display region 204 and the terminals 210, for example.

When the gaps 120 and 122 overlap with the display region 204, the gaps 120 and 122 overlap or intersect with a variety of insulating films and wirings in the display-element layer 200. This mode is explained by using FIG. 6 and FIG. 7.

Figure 6:
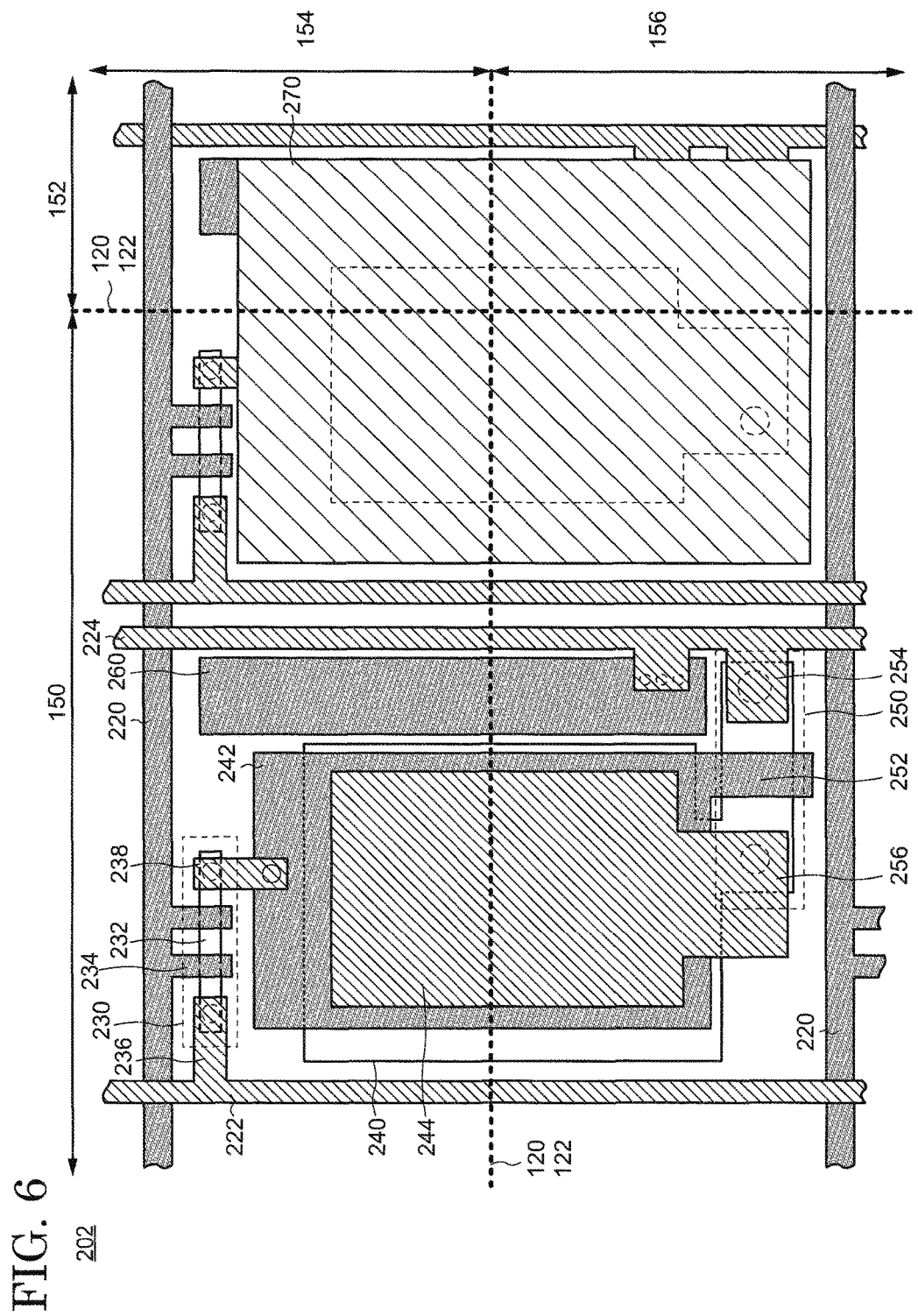
FIG. 6 is a schematic top view of a display device according to an embodiment of the present invention.
Figure 7:
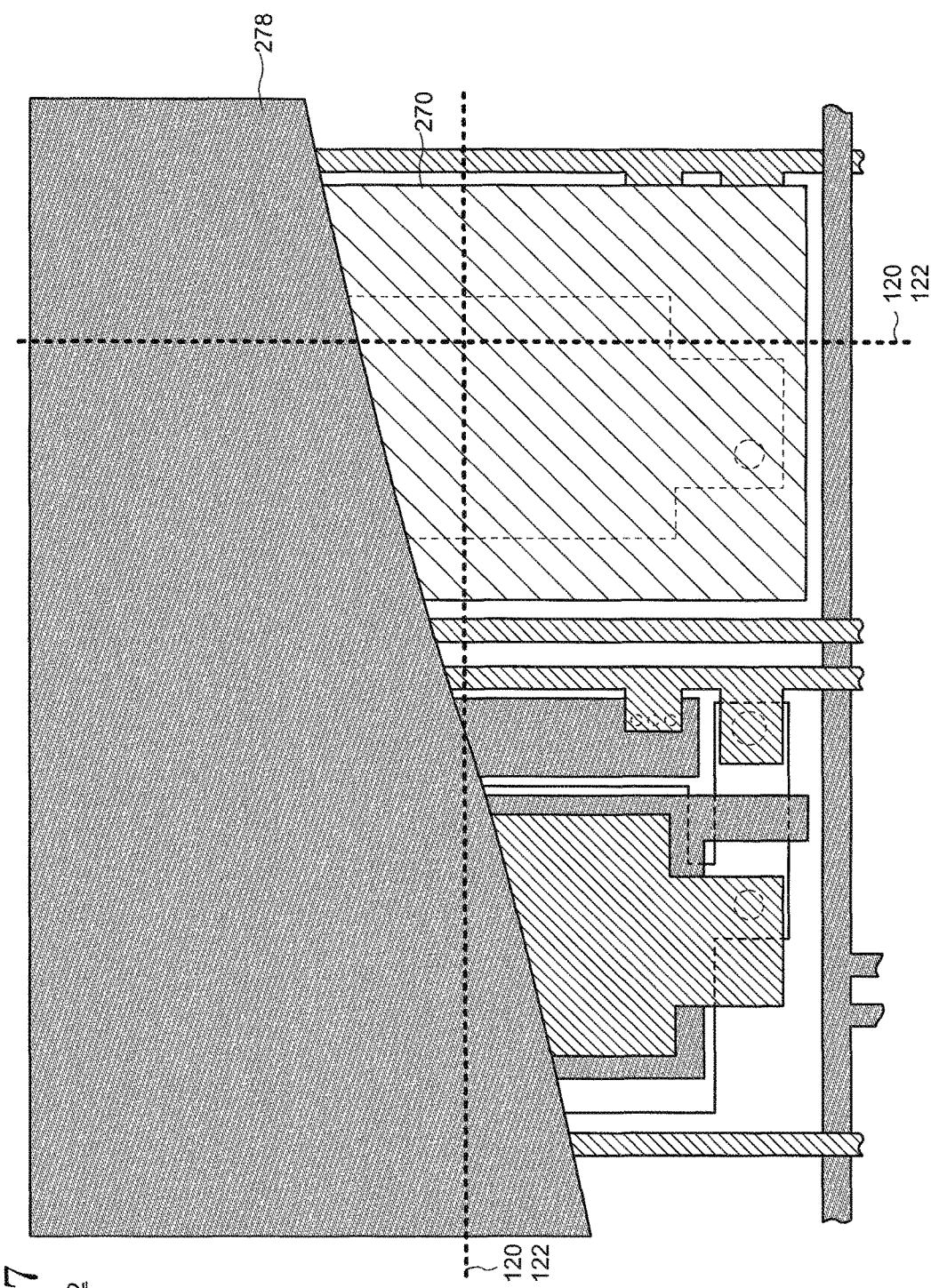
FIG. 7 is a schematic top view of a display device according to an embodiment of the present invention.

FIG. 6 and FIG. 7 are schematic top views of two adjacent pixels 202. In these figures, structural elements are illustrated so as not to overlap with one another for visibility. However, the plurality of structural elements may overlap with one another. Additionally, a part of the structural elements is omitted. Here, the pixels 202 including a light-emitting element are illustratively demonstrated.

As shown in FIG. 6, the display-element layer 200 has wirings including a plurality of gate lines 220, a plurality of data lines 222, a plurality of current-supplying lines 224, and the like. The plurality of pixels 202 are electrically connected to the gate line 220, and two pixels 202 are illustrated in FIG. 6. The data line 222 and the current-supplying line 224 are connected to the plurality of pixels 202 arranged along these wirings.

The pixel 202 possesses transistors 230 and 250. The transistor 230 has a semiconductor film 232, a gate 234, a drain 236, a source 238, and the like. The gate 234 is a part of the gate line 220, and the drain 236 is a part of the data line 222. The transistor 230 has a so-called double-gate structure having two gates 234 in FIG. 6. However, the transistor 230 may have one gate or three or more gates.

The transistor 250 has a part of a semiconductor film 240, a gate 252, a drain 254, a source 256, and the like. The drain 254 is a part of the current-supplying line 224. The source 238 of the transistor 230 is connected to a first capacitor electrode 242 existing in the same layer as the gate line 220, and a part of the first capacitor electrode 242 functions as the gate 252 of the transistor 250. Therefore, signals generated by the driver circuit 208 and input from the data line 222 are input to the gate 252 of the transistor 250 through the transistor 230.

The semiconductor film 240 and a second capacitor electrode 244 are disposed so as to overlap with the first capacitor electrode 242. Although not shown in FIG. 6 and FIG. 7, an insulating film functioning as a gate insulating film of the transistor 230 and the transistor 250 is provided between the first capacitor electrode 242 and the semiconductor film 240, and an insulating film functioning as an interlayer film covering the gates 234 and 252 of the transistors 230 and the transistor 250 is arranged between the semiconductor film 240 and the second capacitor electrode 244 as described below. A capacitor is formed by the first capacitor electrode 242, the gate insulating film, the semiconductor film 240, the interlayer film, and the second capacitor electrode 244 and contributes to maintenance of a potential of the gate 252 of the transistor 250.

A supplementary capacitor electrode 260 is further provided to the pixel 202, and the supplementary capacitor electrode 260 may be electrically connected to the current-supplying line 224. A first electrode 270 functioning as a pixel electrode is formed in each pixel 202. The first electrode 270 is not illustrated in the left pixel 202 in FIG. 6 for visibility. The first electrode 270 is electrically connected to the source 256 of the transistor 250. Although not shown in FIG. 6, a supplementary capacitor is formed by the supplementary capacitor electrode 260, the first electrode 270, and an insulating film provided therebetween and contributes to maintenance of the potential of the gate 252 of the transistor 250.

As shown in FIG. 7, a second electrode 278 is formed over the first electrode 270. The second electrode 278 is provided over the plurality of pixels 202. Therefore, the second electrode 278 is shared by the plurality of pixels 202. An EL layer not illustrated is formed between the first electrode 270 and the second electrode 278, by which the light-emitting element 268 is formed.

Although not shown, the pixel 202 may further possess another element such as a transistor and a capacitor and a wring.

The positions where the gaps 120 and 122 are formed are shown by dotted lines in FIG. 6 and FIG. 7. As described above, the gaps 120 and 122 are formed in the base film 110 and the cap film 122, respectively, and separate the base film 110 and the cap film 112 to give the plurality of regions.

As shown in FIG. 6 and FIG. 7, for example, the gaps 120 and 122 perpendicular to the gate line 220 respectively separate the base film 110 and the cap film 112 into a first region 150 and a second region 152. The gate line 220, the first electrode 270, and the second electrode 278 extend over the first region 150 and the second region 152 and overlap or intersect with the gaps 120 and 122. Similarly, the gaps 120 and 122 parallel to the gate line 220 respectively separate the base film 110 and the cap film 112 into a third region 154 and a forth region 156. The data line 222, the current-supplying line 224, the first electrode 270, the second electrode 278, the supplementary capacitor electrode 260, and the like extend over the third region 154 and the fourth region 156 and overlap or intersect with the gaps 120 and 122.

The first region 150 and the second region 152 respectively correspond to the first base film 110_1 and the second base film 110_2 (alternatively, the first cap film 112_1 and the second cap film 112_2). Therefore, the gate line 220, the first electrode 270, and the second electrode 278 extend over the first base film 110_1 and the second base film 110_2 (the first cap film 112_1 and the second cap film 112_2) and intersect or overlap with a boundary between the first base film 112_1 and the second base film 110_2 (between the first cap film 112_1 and the second cap film 112_2). In a similar way, the third region 154 and the fourth region 156 respectively correspond to the first base film 110_1 and the second base film 110_2 (alternatively, the first cap film 112_1 and the second cap film 112_2). Hence, the data line 222, the current-supplying line 224, the first electrode 270, the second electrode 278, the supplementary capacitor electrode 260, and the like extend over the first base film 110_1 and the second base film 110_2 (the first cap film 112_1 and the second cap film 112_2) and overlap or intersect with a boundary between the first base film 110_1 and the second base film 110_2 (between the first cap film 112_1 and the second cap film 112_2).

As described above, both or at least one of the base film 110 and the cap film 112 are/is provided with the gaps 120 and 122, which improves durability of the display device 100 to deformation. Accordingly, a display device with high reliability can be produced.

Second Embodiment

In the present embodiment, a manufacturing method of the display device 100 described in the First Embodiment is explained. The structures the same as those of the First Embodiment may be omitted.

1. Process Flow 1

Figure 8:
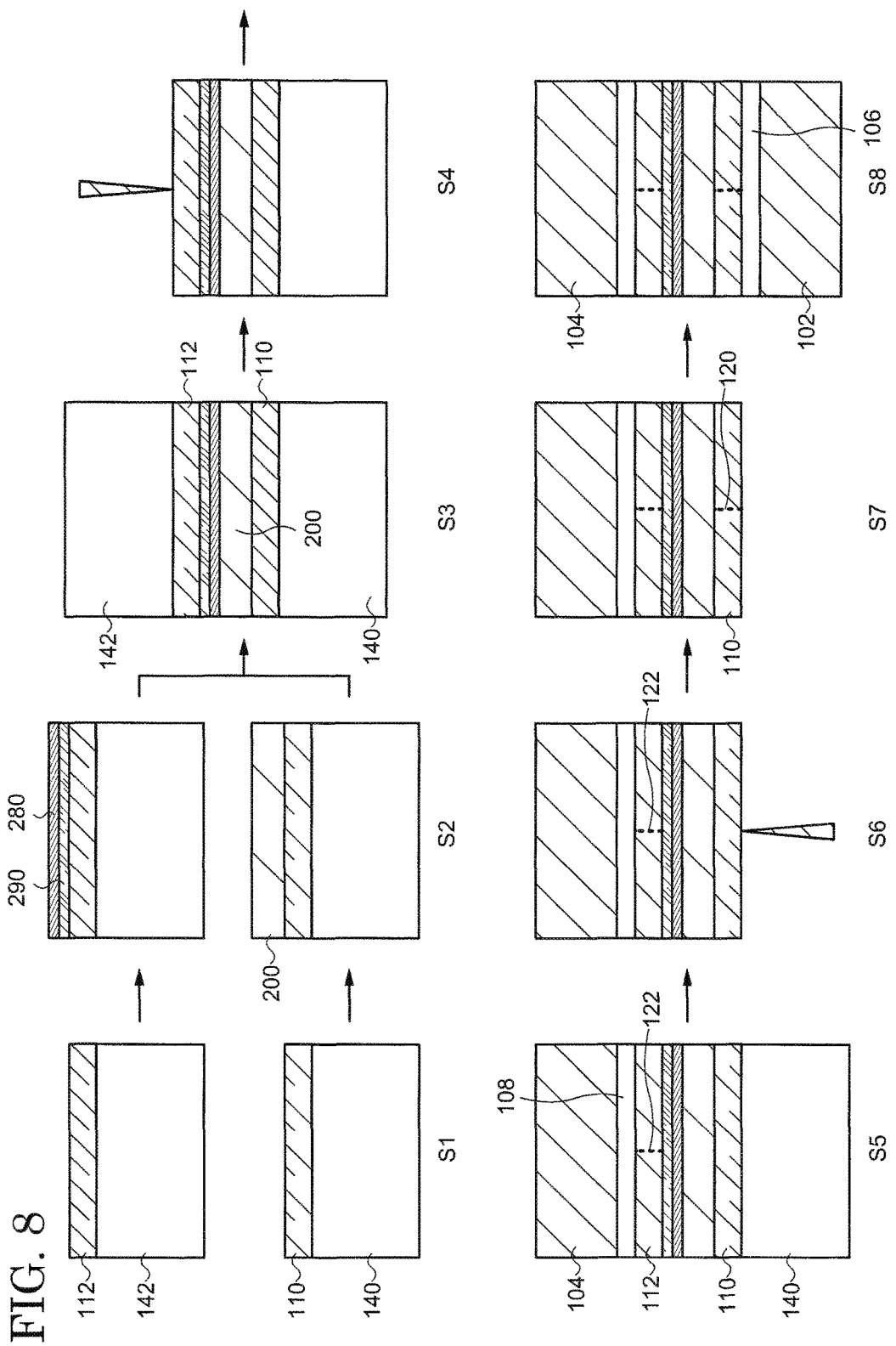
FIG. 8 is a schematic cross-sectional view showing an outline of a manufacturing method of a display device according to an embodiment of the present invention.

An example of a process flow of the display device 100 is schematically shown in FIG. 8.

As shown in FIG. 8, the base film 110 is formed over a first supporting substrate 140 (S1). After that, the display-element layer 200 is formed over the base film 110 (S2).

The cap film 112 is formed over another second supporting substrate 142 (S1), over which the polarizing plate 290 and the touch sensor 280 are successively formed (S2).

After that, the first supporting substrate 140 and the second supporting substrate 142 are bonded to each other so that the base film 110, the display-element layer 200, the polarizing plate 290, the touch sensor 280, and the cap film 112 are sandwiched therebetween (S3). Next, the second supporting substrate 142 is separated from the cap film 112, which is followed by formation of the gap 122 by irradiating the cap film 112 with light such as a laser or mechanical formation of the gap 122 by using a knife or the like (S4 and S5).

After forming the gap 122, the second protection sheet 104 is bonded to the cap film 112 via the adhesion layer 108 (S5). After that, the first supporting substrate 140 is separated from the base film 110 (S6), and the gap 120 is formed in the base film 110 with the same method as that of the gap 122 (S6 and S7).

After the formation of the gap 120, the first protection sheet 102 is bonded to the base film 110 via the adhesion layer 106 (S8). With this process flow, the display device 100 can be manufactured. In this process flow, the gap 120 is formed in the base film 110 after the formation of the gap 122 in the cap film 112. However, the order is not limited. Thus, the first supporting substrate 140 may be first separated after bonding the first supporting substrate 140 and the second supporting substrate 142. After that, the gap 120 may be formed in the base film 110, and then the bonding of the first protection sheet 102, the separation of the second supporting substrate 142, and the formation of the gap 122 in the cap film 112 may be sequentially performed.

2. Process Flow 2

Figure 9:
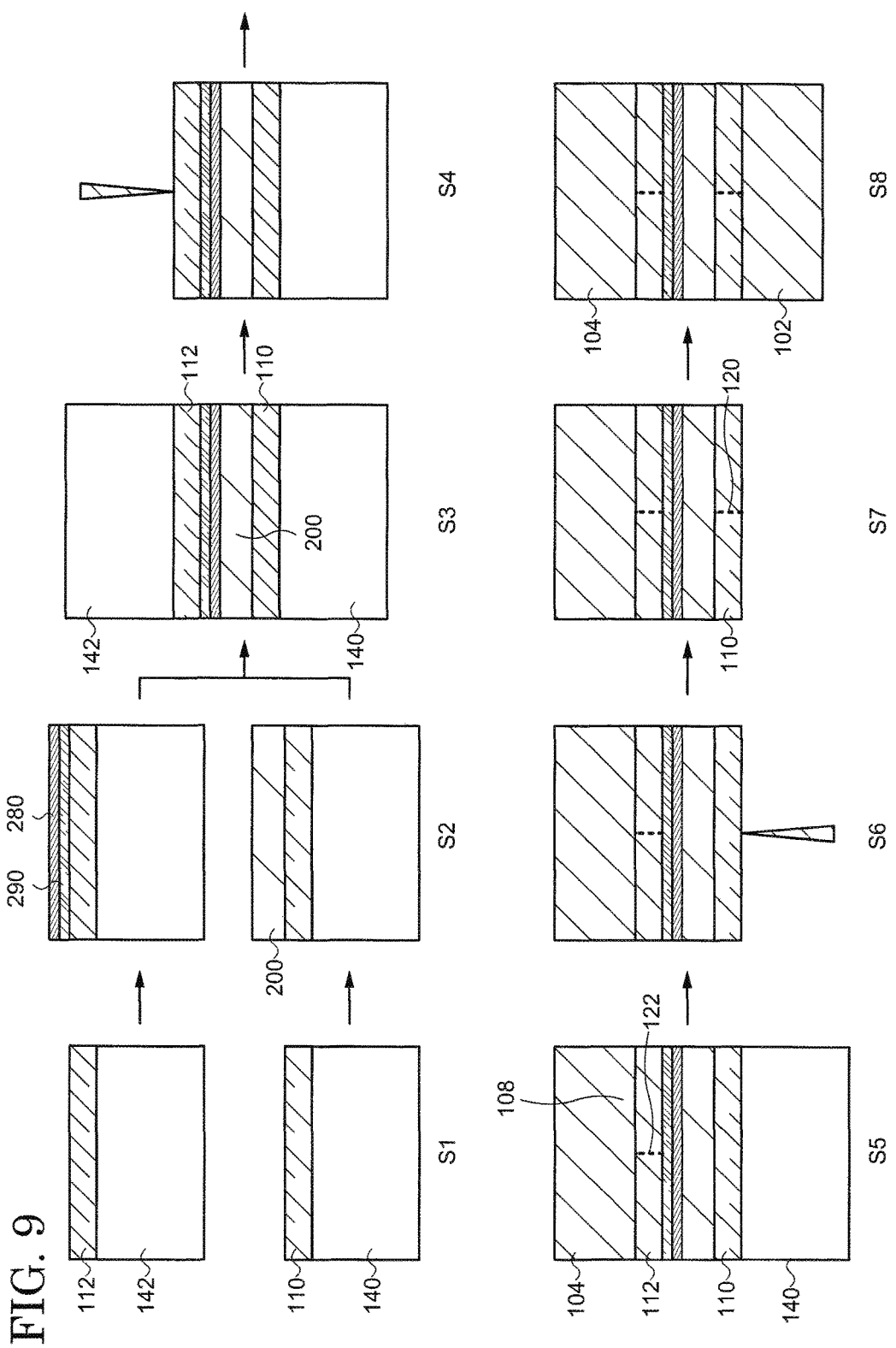
FIG. 9 is a schematic cross-sectional view showing an outline of a manufacturing method of a display device according to an embodiment of the present invention.

The display device 100 may also be prepared with a flow (process flow 2) shown in FIG. 9. The process flow shown in FIG. 9 is different from the process flow 1 in that the adhesion layers 106 and 108 are not used when the first protection sheet 102 and the second protection sheet 104 are bonded (S5, S8). In this case, the first protection sheet 102 and the second protection sheet 104 are in direct contact with the base film 110 and the cap film 112, respectively. Note that the display device 100 may be manufactured by using the adhesion layer in bonding one of the protection sheet 102 and the second protection sheet 104 without the use of any adhesion layer when the other is bonded.

3. Process Flow 3

Figure 10:
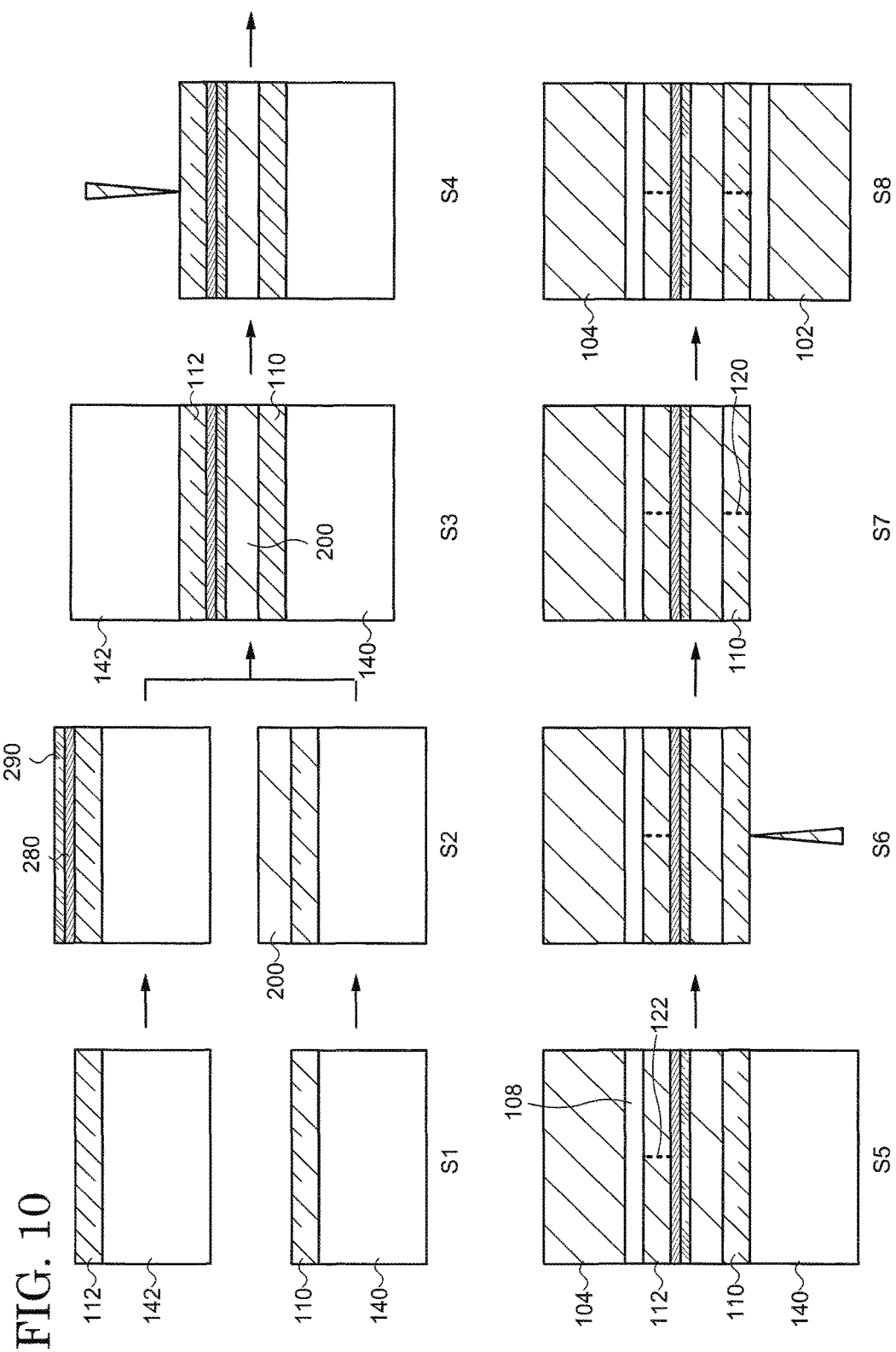
FIG. 10 is a schematic cross-sectional view showing an outline of a manufacturing method of a display device according to an embodiment of the present invention.

The display device 100 may also be prepared with a flow (process flow 3) shown in FIG. 10. The process flow shown in FIG. 10 is different from the process flow 1 in that the polarizing plate 290 is formed after the touch sensor 280 is formed over the second supporting substrate 142 (S2). The use of this flow allows a distance between the touch sensor 280 and the second electrode 278 of the light-emitting element 268 to be increased. Hence, influence of an electric field by the second electrode 278 of the light-emitting element 268 on the operation of the touch sensor 280 can be reduced, by which a touch can be sensed with higher sensitivity at higher accuracy.

4. Process Flow 4

The display device 100 may also be prepared with a flow (process flow 4) shown in FIG. 11. The process flow shown in FIG. 11 is different from the process flow 1 in that the touch sensor 280 is formed over the display-element layer 200 after the display-element layer 200 is formed over the first substrate 140 (S2). The use of this flow allows direct formation of the touch sensor 280 over a variety of elements such as the transistors 230 and 250, the capacitors, and the light-emitting element 268, by which the wirings for driving the touch sensor 280 as well as the wirings for driving the pixels 202 and the terminals 210 of the display-element layer 200 can be integrated in the same layer. As a result, the signals can be supplied to the display-element layer 200 and the touch sensor 280 by using one connector 212.

5. Process Flow 5

The display device 100 may also be prepared with a flow (process flow 5) shown in FIG. 12. The process flow shown in FIG. 12 is different from the process flow 1 in that the gaps 120 and 122 are prepared by performing light irradiation or mechanical processing on the base film 110 and the cap film 112 after the base film 110 and the cap film 112 are respectively formed over the first supporting substrate 140 and the second supporting substrate 142 (S1) and before the display-element layer 200, the polarizing plate 290, and the touch sensor 280 are formed. (S2).

6. Manufacturing Method

Hereinafter, a manufacturing method of the display device 100 according to the aforementioned process flow 4 is specifically explained by using FIG. 13A to FIG. 26. As shown in FIG. 26, FIG. 13A to FIG. 26 correspond to a cross section of a region extending through the plurality of pixels 202. Although the structure of the pixels 202 shown in FIG. 13A to FIG. 26 may not be consistent with the layout of the pixels 202 shown in FIG. 6 and FIG. 7, the elements indicated by the same reference number are the same in each figure.

6-1. Base Film

As shown in FIG. 13A, the base film 110 is first formed over the first supporting substrate 140. The first supporting film 140 has a function to support the base film 110, the display-element layer 200, the touch sensor 280, the polarizing plate 290, and the like. Therefore, a material having heat resistance to the process temperature of these structural members formed thereover and chemical stability to the chemicals used in the process can be used for the first supporting substrate 140. Specifically, the first supporting substrate 140 may include glass, quartz, plastics, a metal, ceramics, and the like.

The base film 110 is an insulating film with flexibility and may include a material selected from the polymer materials described in the First Embodiment. The base film 110 can be formed by applying a wet-type film-forming method such as a printing method, an ink-jet method, a spin-coating method, and a dip-coating method or a lamination method.

6-2. Display-Element Layer

Next, an undercoat 214 is formed over the base film 110 as shown in FIG. 13A. The undercoat 214 is a film having a function to prevent impurities such as an alkaline metal from diffusing to the display-element layer 200 from the first supporting substrate 140 and the base film 110 and may include an inorganic insulator such as silicon nitride, silicon oxide, silicon nitride oxide, and silicon oxynitride. The undercoat 214 can be formed to have a single-layer or stacked-layer structure by applying a chemical vapor deposition method (CVD method), a sputtering method, or the like. When a stacked-layer structure is employed, a structure can be used where a film including silicon nitride is sandwiched by films including silicon oxide. When an impurity concentration in the base film 110 is low, the undercoat 214 may not be provided or may be formed to cover a part of the base film 110.

Next, a semiconductor film 240 is formed (FIG. 13B). The semiconductor film 240 may contain Group 14 elements such as silicon, for example. Crystallinity of the semiconductor film 240 is not limited, and the semiconductor film 240 may exist in a crystal state of a single crystalline, polycrystalline, microcrystalline, or amorphous state. Alternatively, these crystalline states may be mixed in the semiconductor film 240. Alternatively, the semiconductor film 240 may include an oxide semiconductor. As an oxide semiconductor, Group 13 elements such as indium and gallium are represented, and a mixed oxide of indium and gallium (IGO) is exemplified. When an oxide semiconductor is used, the semiconductor film 240 may further contain a Group 12 element, and a mixed oxide of indium, gallium, and zinc (IGZO) is given as an example.

When the semiconductor film 240 includes silicon, the semiconductor film 240 may be prepared with a CVD method by using silane gas and the like as a raw material. A heat treatment or application of light such as a laser may be performed on amorphous silicon obtained to conduct crystallization. When the semiconductor film 240 includes an oxide semiconductor, the semiconductor film 240 can be formed by utilizing a sputtering method or the like.

Next, a first doping is conducted on the semiconductor film 240 to form doped regions 240_2 and an undoped region 240_1 (FIG. 13C). Specifically, a resist film is formed over a portion where the undoped regions 240_1 are to be formed, and then the semiconductor film 240 is doped with ions. Ions of phosphorus and nitrogen imparting a n-type conductivity may be used. After that, the resist film is removed to obtain the state shown in FIG. 13C.

Next, the gate insulating film 216 is prepared so as to cover the semiconductor film 240 (FIG. 14A). The gate insulating film 216 may have a single-layer structure or a stacked-layer structure and may include a material usable for the undercoat 214. The gate insulating film 216 can be prepared with a CVD method, or a sputtering method, or the like.

Next, the gate 252 and the first capacitor electrode 242 existing in the same layer as the gate 252 are formed over the gate insulating film 216 with a sputtering method or a CVD method (FIG. 14A). The gate electrode 252 is provided so as to overlap with the undoped region 240_1. The gate 252 may be formed with a metal such as titanium, aluminum, copper, molybdenum, tungsten, and tantalum or an alloy thereof so as to have a single-layer or stacked-layer structure. For example, a structure in which a highly conductive metal such as aluminum and copper is sandwiched by a metal with a relatively high melting point, such as titanium, tungsten, and molybdenum, can be employed.

Next, a second doping is carried out on the semiconductor film 240 by using the gate 252 as a mask (FIG. 14B). The doping conditions at this time are adjusted so that the semiconductor film 240 is doped at a lower concentration compared with that of the first doping. With this procedure, low-concentration doped regions 240_3 are formed in the regions of the undoped region 240_1 which do not overlap with the gate 252 over the undoped region 240_1. The low-concentration doped regions 240_3 have a lower impurity concentration than the doped regions 240_2. The undoped region 240_1 is a region undoped or substantially undoped with impurities and functions as a channel region.

Next, an interlayer film 218 is formed over the first capacitor electrode 242 (FIG. 14C). The interlayer film 218 may have a single-layer or stacked layer structure, may include a material usable for the undercoat 214, and may be prepared with a CVD method, a sputtering method, or the like.

Figure 15A:
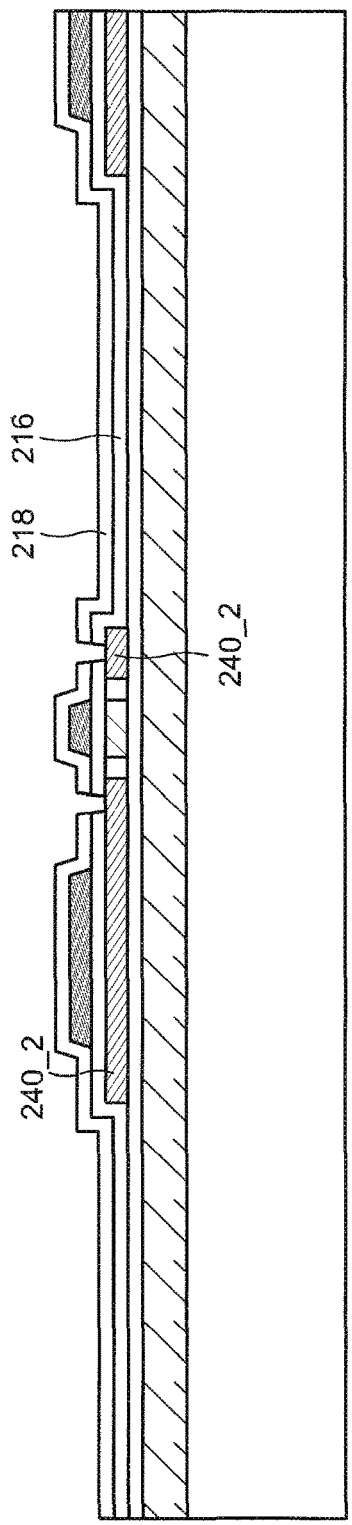
FIG. 15A and FIG. 15B are schematic cross-sectional views showing a manufacturing method of a display device according to an embodiment of the present invention.

Next, etching is performed on the interlayer film 218 and the gate insulating film 216 to form opening portions reaching the doped regions 240_2 (FIG. 15A). The opening portions can be prepared, for example, by conducting plasma etching in a gas including a fluorine-containing hydrocarbon.

Figure 15B:
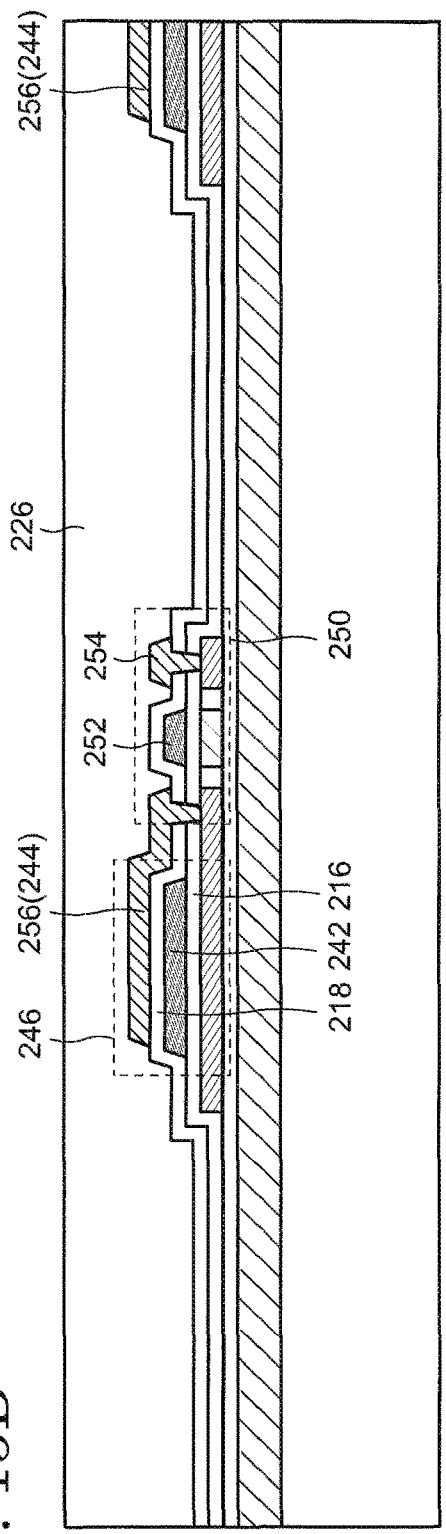

Next, a metal film is formed to cover the opening portions and processed with etching to form a source 256 and a drain 254 (FIG. 15B). With this step, the transistor 250 is fabricated. Here, the source 256 also serves as the second capacitor electrode 244 and partly overlaps with the first capacitor electrode 242. The capacitor 246 is formed by the doped region 240_2 and the gate insulating film 216 which overlap with the first capacitor electrode 242, the first capacitor electrode 242, the interlayer film 218 sandwiched by the first capacitor electrode 242 and the second capacitor electrode 244, and the second capacitor electrode 244. The capacitor 246 contributes to maintenance of a potential of the gate 252.

The metal film may include a metal usable for the gate 252 and may have a single-layer or stacked layer structure. The metal film can be formed by applying a sputtering method or a CVD method.

Next, a leveling film 226 is formed (FIG. 15B). The leveling film 226 has a function to absorb depressions and projections caused by the transistor 250, the capacitor 246, and the like and provide a flat surface. The leveling film 226 can be prepared with an organic insulator. As an organic insulator, a polymer material such as an epoxy resin, an acrylic resin, a polyimide, a polyamide, a polyester, a polycarbonate, and a polysiloxane is represented, and the leveling film 226 can be formed with the aforementioned wet-type film-forming method. The leveling film 226 may have a stacked-layer structure of a layer including the aforementioned organic insulator and a layer including an inorganic insulator. In this case, a silicon-containing inorganic insulator such as silicon oxide, silicon nitride, silicon nitride oxide, and silicon oxynitride is represented as an inorganic insulator, and a film including these materials can be formed with a sputtering method or a CVD method.

After that, etching is performed on the leveling film 226 to form an opening portion reaching the source 256. After that, a connection electrode 248 is prepared so as to cover this opening portion (FIG. 16A). The connection electrode 248 may be formed by using a conductive oxide transmitting visible light, such as indium-tin oxide (ITO) and indium-zinc oxide (IZO), with a sputtering method or the like. Note that it is not always necessary to form the connection electrode 248. The formation of the connection electrode 248 enables protection of an exposed metal surface such as a surface of the source 256 in the following processes, by which an increase in contact resistance can be prevented.

Next, the supplementary capacitor electrode 260 is formed by using a metal such as aluminum, copper, titanium, molybdenum, tungsten, and tantalum or an alloy thereof (FIG. 16B). The supplementary capacitor electrode 260 may also have a single layer structure or a stacked layer structure, and a stacked-layer structure of molybdenum/aluminum/molybdenum may be employed, for example. The supplementary capacitor electrode 260 forms the supplementary capacitor 262 in association with the first electrode 270 of the light-emitting element 268 formed later.

After that, the insulating film 228 is formed (FIG. 16B). The insulating film 228 may include a material usable for the undercoat 214 and the gate insulating film 216, such as silicon nitride, and the formation method thereof can be applied. The insulating film 228 has an opening portion for exposing a contact portion (that is, a bottom surface of the connection electrode 248 formed in the opening portion formed in the leveling film 226) where an electrical connection between the transistor 250 and the light-emitting element 268 is conducted.

Figure 17A:
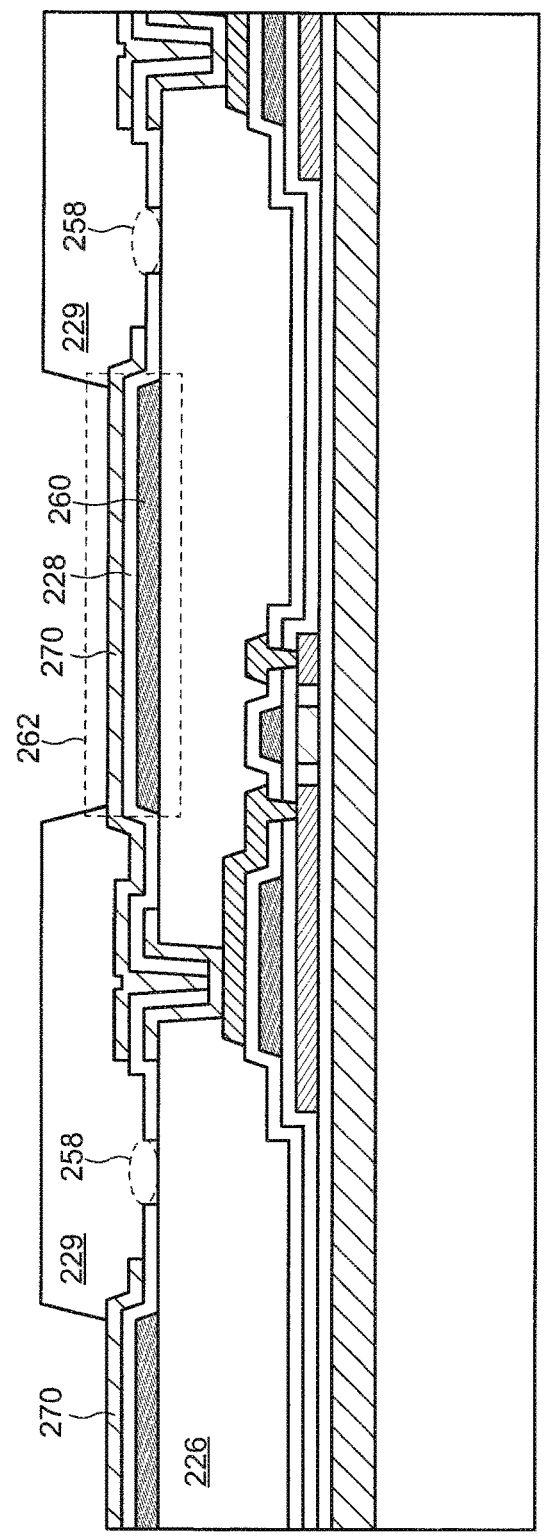
FIG. 17A and FIG. 17B are schematic cross-sectional views showing a manufacturing method of a display device according to an embodiment of the present invention.

Next, the first electrode 270 of the light-emitting element 268 is formed (FIG. 17A). When the light emission from the light-emitting element 268 is extracted through the first electrode 270, a material having a light-transmitting property exemplified by a conductive oxide such as ITO and IZO can be used. On the other hand, when the light emission from the light-emitting element 268 is extracted from a side opposite to the first electrode 270 (through the second electrode 278), a metal such as aluminum and silver or an alloy thereof may be used. Alternatively, stacked layers of the metal or alloy with the conductive oxide, such as a stacked-layer structure in which the metal is sandwiched by the conductive oxide (e.g., ITO/silver/ITO), can be employed. As described above, the supplementary capacitor 262 is formed by the first electrode 270, the supplementary capacitor electrode 260, and the insulating film 228 sandwiched therebetween.

After the formation of the first electrode 270, a partition wall 229 is formed (FIG. 17A). The partition wall 229 has a function to absorb steps caused by an edge portion of the first electrode 270 and the opening portion provided in the leveling film 226 and electrically insulate the first electrodes 270 of the adjacent pixels 202. The partition wall 229 is also called a bank (rib). The partition wall 229 may be prepared with a material usable for the leveling film 226. The partition wall 229 has an opening exposing a part of the first electrode 270, and an edge of the opening portion is preferred to have a gradually tapered shape. When the edge of the opening portion has a steep slope with respect to the first electrode 270, coverage failure of the EL layer 274 and the second electrode 278 formed later readily occurs.

As shown in FIG. 17A, an opening portion 258 may be provided to the insulating film 228 so that the leveling film 226 and the partition wall 229 make direct contact with each other. The use of such a structure allows impurities such as water eliminated from the leveling film 226 to be released in the heat treatment and the like after the formation of the partition wall 229.

Figure 17B:
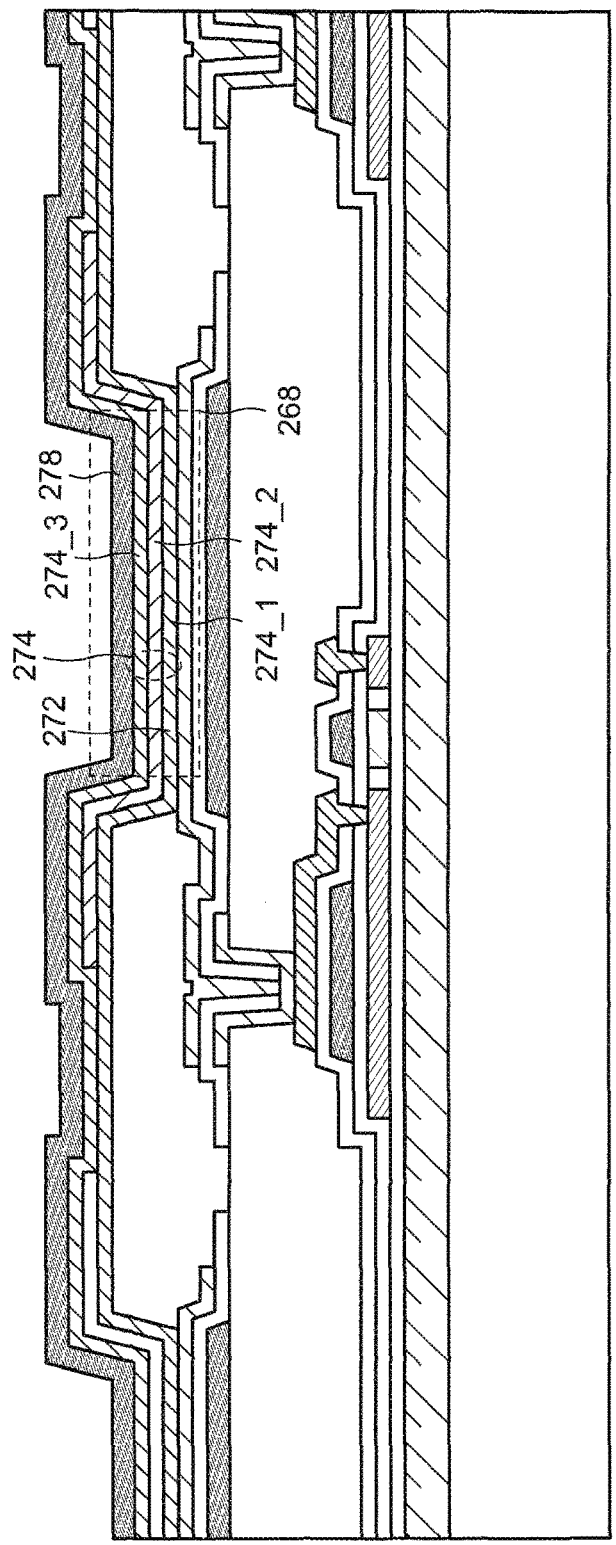

After the formation of the partition wall 229, the EL layer 274 of the light-emitting element 268 and the second electrode 274 over the EL layer 274 are formed (FIG. 17B).

Here, a structure is illustrated in which the EL layer 274 is composed of a first layer 274_1, a second layer 274_2, and a third layer 274_3. However, the present embodiment is not limited thereto, and an EL layer having a single-layer structure or an EL layer having a structure of four or more layers may be employed. For example, a carrier-injection layer, a carrier-transporting layer, an emission layer, a carrier-blocking layer, an exciton-blocking layer, and the like may be appropriately used. Alternatively, one layer may have a plurality of functions. The EL layer 274 can be prepared with an evaporation method, an ink-jet method, a printing method, a spin-coating method, or the like.

In the example shown in FIG. 17B, the first layer 274_1 and the third layer 274_3 of the EL layer 274 are a carrier-injection layer, a carrier-transporting layer, or stacked layers thereof and are formed so as to extend over the adjacent pixels 202. That is, they are shared by each of the pixels 202. On the other hand, the second layer 274_2 is an emission layer and may have a different material or structure in every pixel 202. Thus, emission colors different between the adjacent pixels 202 can be obtained, thereby enabling a full-color display. However, the second layer 274_2 may be configured to be white emissive and shared by all of the pixels 202. In this case, a wavelength of light extracted from each pixel 202 is selected by using a color filter or the like to perform a full-color display.

After forming the EL layer 274, the second electrode 278 is formed. The light-emitting element 268 is fabricated by the first electrode 270, the EL layer 274, and the second electrode 278. Carriers (electrons and holes) are injected to the EL layer 274 from the first electrode 270 and the second electrode 278, and recombination of the carriers results in an excited state. Light-emission is obtained through a relaxation process of the excited state to a ground state. Thus, a region in which the EL layer 274 and the first electrode 270 are in direct contact with each other is an emission region in the light-emitting element 268.

When the light emission from the light-emitting element 268 is extracted through the first electrode 270, a metal such as aluminum and silver or an alloy thereof can be used for the second electrode 278. On the other hand, when the light emission from the light-emitting element 268 is extracted through the second electrode 278, the second electrode 278 is prepared by using the metal or the alloy so as to have a thickness to transmit visible light. Alternatively, a material having a light-transmitting property, such as a conductive oxide exemplified by ITO and IZO, can be used for the second electrode 278. Additionally, a stacked-layer structure of the metal or alloy with the conductive oxide (e.g., M-Ag/ITO, etc.) may be employed for the second electrode 278.

Figure 18:
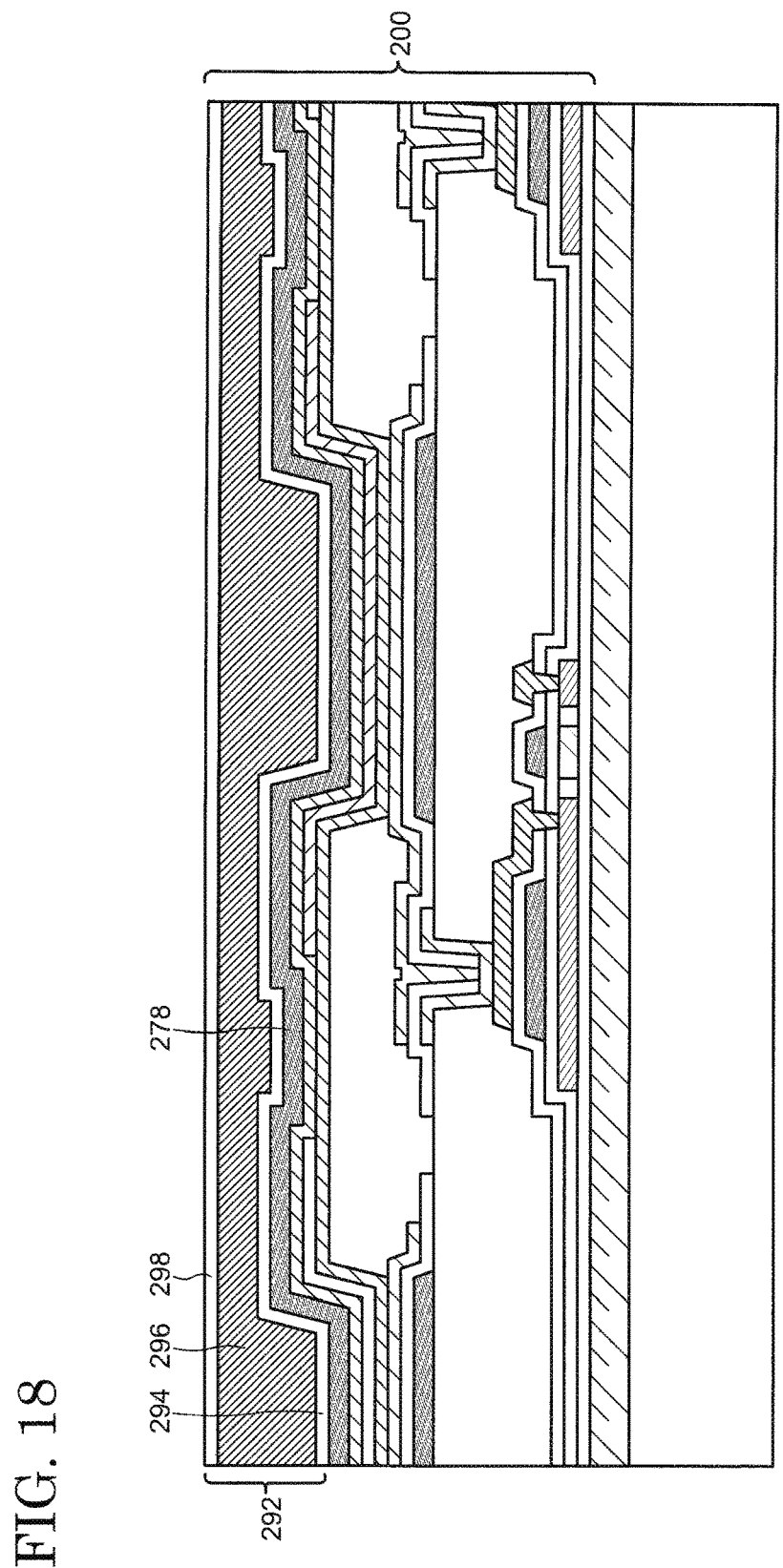
FIG. 18 is a schematic cross-sectional view showing a manufacturing method of a display device according to an embodiment of the present invention.

After the formation of the second electrode 278, a protection film (passivation film) 292 is formed as an optional structure (FIG. 18). The passivation film 292 has a function to prevent moisture from entering the light-emitting element 268 from outside and is preferred to have a high gas-barrier property. The structure of the passivation film 292 can be arbitrarily determined and may have a three-layer (a first layer 294, a second layer 296, and a third layer 298) structure as shown in FIG. 18.

The first layer 294 may include an inorganic material such as silicon nitride, silicon oxide, silicon nitride oxide, and silicon oxynitride and can be formed with a CVD method or a sputtering method, for example.

Next, the second layer 296 is formed (FIG. 18). The second layer 296 may include an organic resin including an acrylic resin, a polysiloxane, a polyimide, and a polyester.

Furthermore, as shown in FIG. 18, the second layer 296 may be formed at a thickness so that depressions and projections caused by the partition wall 229 are absorbed and a flat surface is provided. The second layer 296 may be formed by a wet-type film-forming method such as an ink-jet method. Alternatively, the second layer 296 may be prepared by atomizing or vaporizing oligomers serving as a raw material of the aforementioned polymer material at a reduced pressure, spraying the first layer 294 with the oligomers, and then polymerizing the oligomers.

After that, the third layer 298 is formed. The third layer 298 may include a material usable in the first layer 294 and may be formed with the method applicable to the formation of the first layer 294.

Through these processes, the display-element layer 200 is fabricated.

6-3. Touch Sensor

Figure 19:
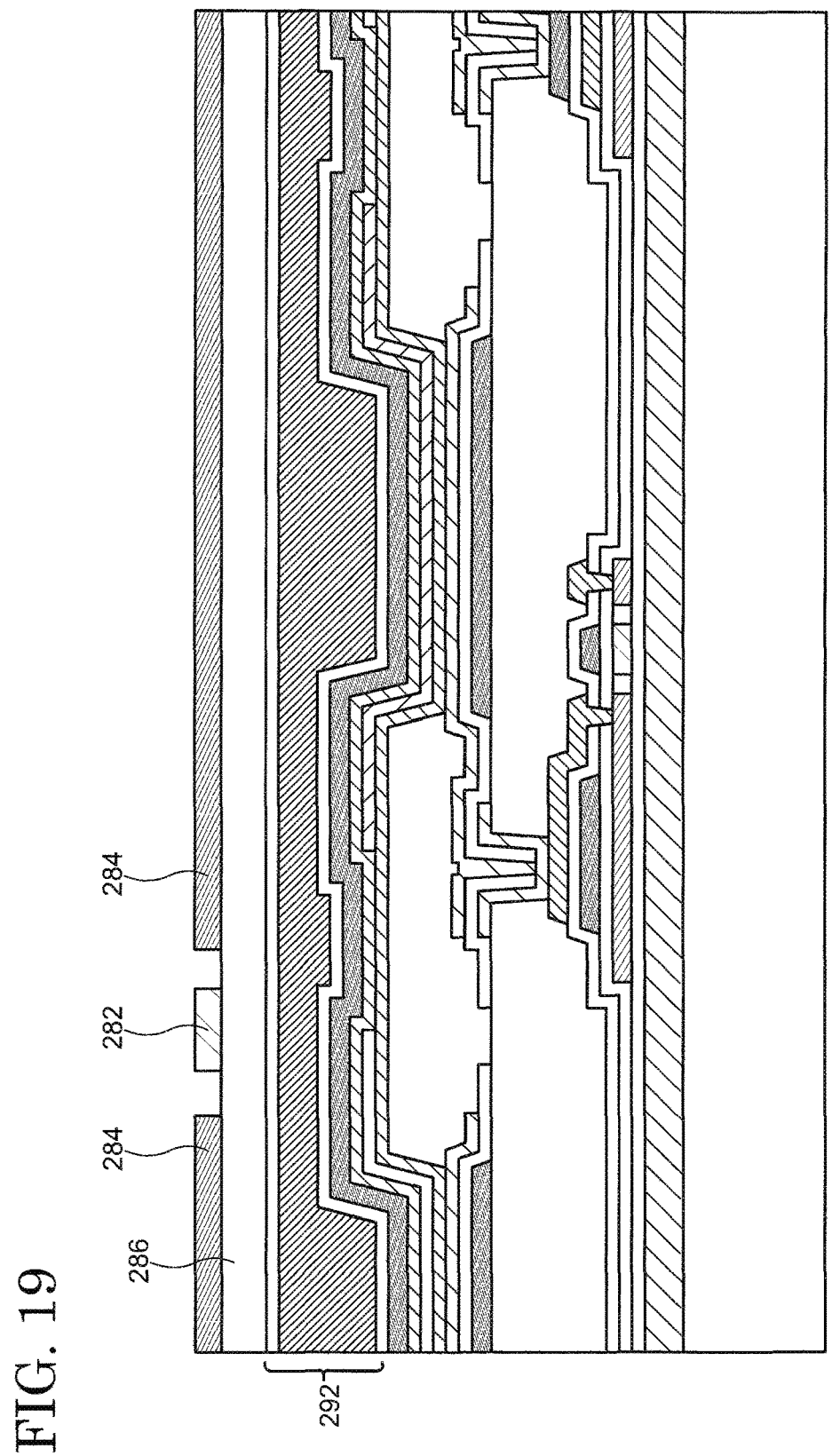
FIG. 19 is a schematic cross-sectional view showing a manufacturing method of a display device according to an embodiment of the present invention.

Next, the touch sensor 280 is formed as an optional structure. First, an insulating film 286 is formed over the passivation film 292 (FIG. 19). The insulating film 286 has a function to increase a distance between the light-emitting element 268 and the touch sensor 280 or a function to adhere the first touch electrode 282 or the second touch electrode 284 of the touch sensor 280 to the display-element layer 200. The insulating film 286 may contain a silicon-containing inorganic compound such as silicon oxide, silicon nitride, silicon oxynitride, and silicon nitride oxide or a polymer material such as an epoxy resin, an acrylic resin, a polyimide, a polyamide, a polyester, and a polycarbonate. When an inorganic compound is included, the insulating film 286 can be formed by applying a CVD method or a sputtering method. When a polymer material is used, a wet-type film-forming method or a lamination method may be used. Note that the insulating film 286 is an optional structure and may not be provided.

After that, the first touch electrode 282 and the second touch electrode 284 are formed (FIG. 19). The first touch electrode 282 and the second touch electrode 284 may include a transparent conductive oxide such as ITO and IZO and can be formed with a sputtering method. Alternatively, the first touch electrode 282 and the second touch electrode 284 may be prepared in a mesh form in a plane view so as to be disposed in a region which does not overlap with the light-emitting element. In this case, since a light-transmitting property is not required, a metal material with low resistance can be used. Here, a mode is illustrated where the first touch electrode 282 and the second touch electrode 284 exist in the same layer. In this case, the first touch electrode 282 and the second touch electrode 284 can be prepared at the same time.

Figure 20:
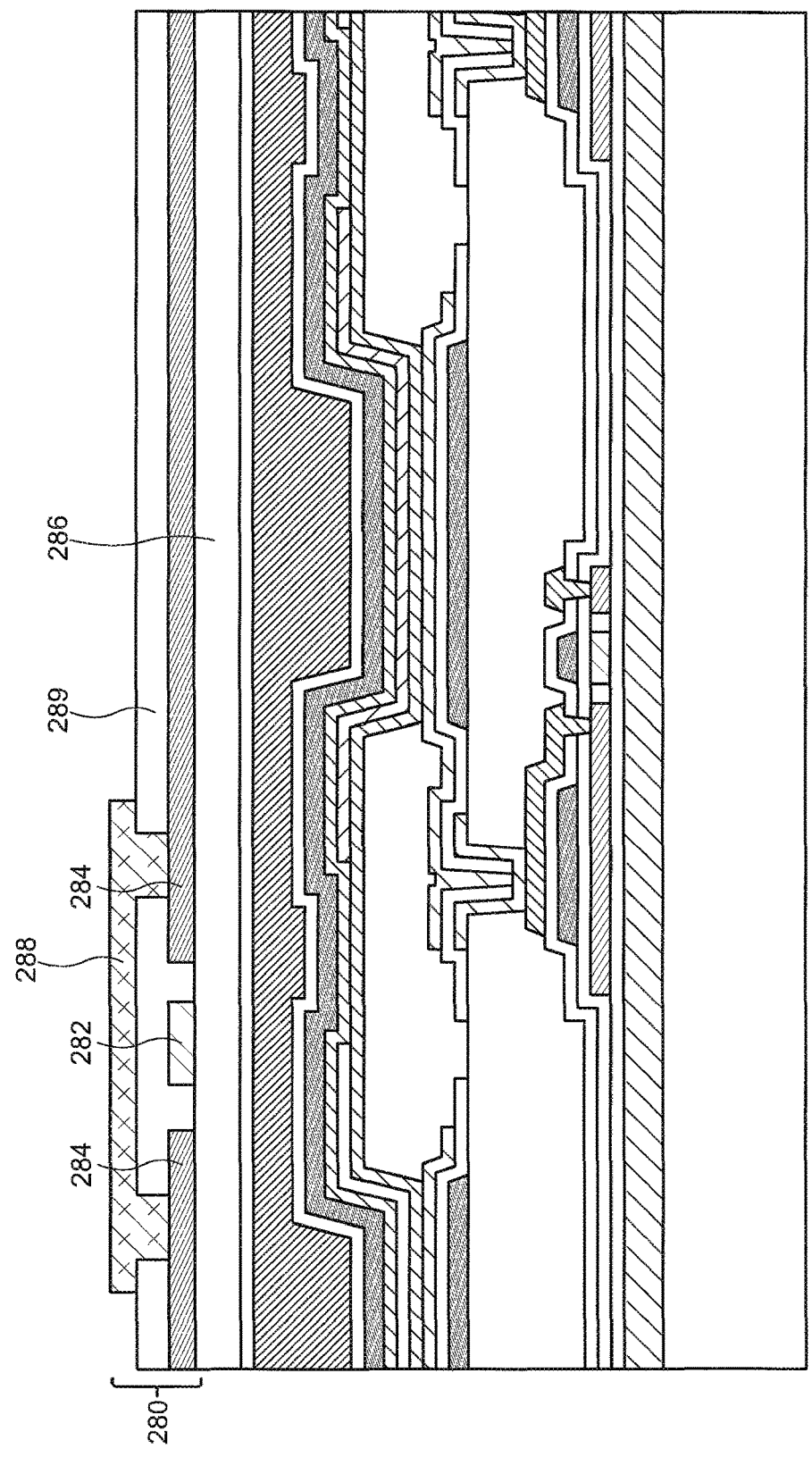
FIG. 20 is a schematic cross-sectional view showing a manufacturing method of a display device according to an embodiment of the present invention.

Next, the interlayer insulating film 289 is formed over the first touch electrode 282 and the second touch electrode 284 (FIG. 20). The interlayer insulating film 289 may include a material usable in the insulating film 286 and may be formed with a method applicable to the formation of the insulating film 286.

After that, the bridge electrode 288 connecting the diamond electrodes of the second touch electrode 284 is formed. The bridge electrode 288 may also include a transparent conductive oxide and can be formed by using a sputtering method. Through these processes, the touch sensor 280 is fabricated. Note that, although not shown, a protection film for protecting the touch sensor 280 may be disposed over the touch sensor 280. The protection film may include a polymer material such as a polyester, an epoxy resin, and an acrylic resin and can be formed by applying a wet-type film-forming method or a lamination method.

6-4. Polarizing Plate

Figure 21A:
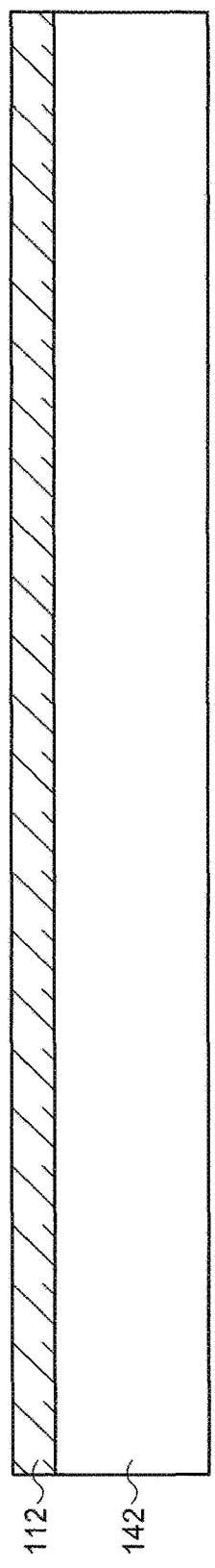
FIG. 21A and FIG. 21B are schematic cross-sectional views showing a manufacturing method of a display device according to an embodiment of the present invention.

As shown in FIG. 21A, the cap film 112 is formed over the second supporting substrate 142. As the second supporting substrate 142, a substrate including a material usable for the first supporting substrate 140 can be used. The cap film 112 can be formed with a material usable in the base film 110. As described in the First Embodiment, the glass transition temperature or the melting point of the cap film 112 may be lower than that of the base film 110. Alternatively, the transmittivity of the base film 110 in a visible region may be lower than that of the cap film 112. Thus, the base film 110 may have a deeper color than the cap film 112.

Figure 21B:
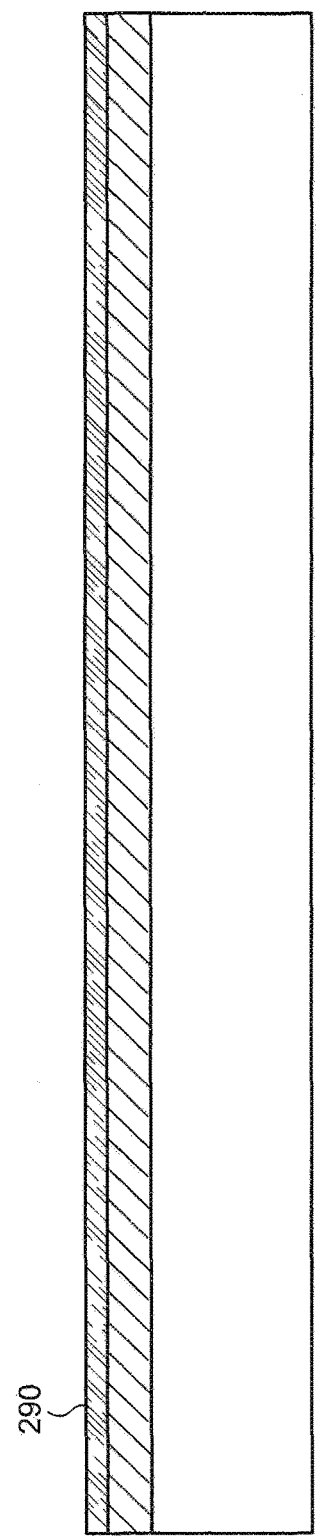

Next, the polarizing plate 290 is formed over the cap film 112 (FIG. 21B). As described above, the polarizing plate 290 may be a linear polarizing plate or a circularly polarizing plate. It is preferred to use a circularly polarizing plate in order to effectively suppress reflection of external light in the display-element layer 200.

6-5. Formation of Gap

Figure 22:
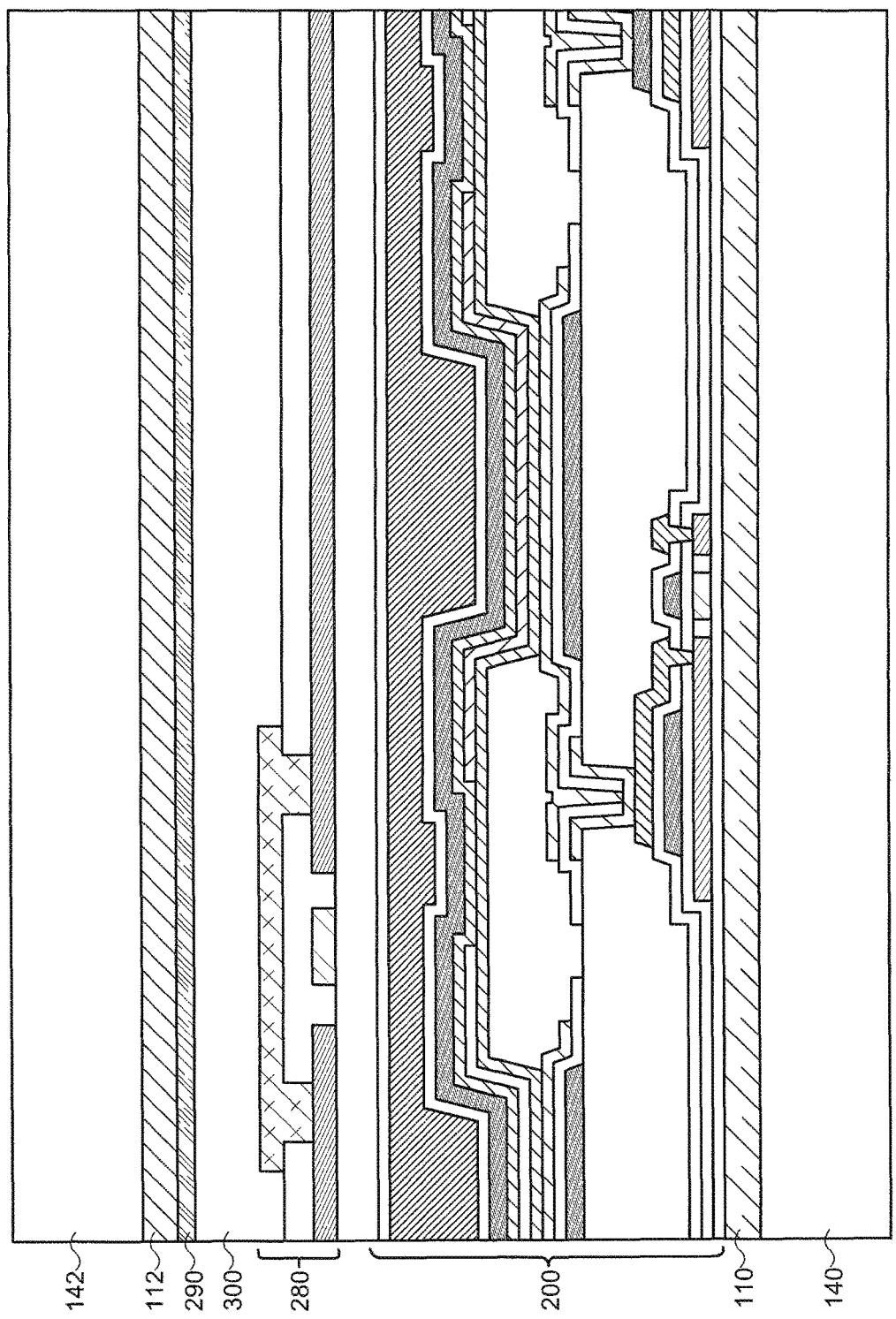
FIG. 22 is a schematic cross-sectional view showing a manufacturing method of a display device according to an embodiment of the present invention.

Next, as shown in FIG. 22, the first supporting substrate 140 and the second supporting substrate 142 are bonded with an adhesion layer 300 so as to sandwich the display-element layer 200, the touch sensor 280, and the polarizing plate 290. An adhesive arbitrarily selected from an epoxy-based adhesive, an acrylic-based adhesive, an adhesive based on silicon rubber, an olefin-based adhesive, a urethane-based adhesive, and the like can be used for the adhesion layer 300.

Figure 23:
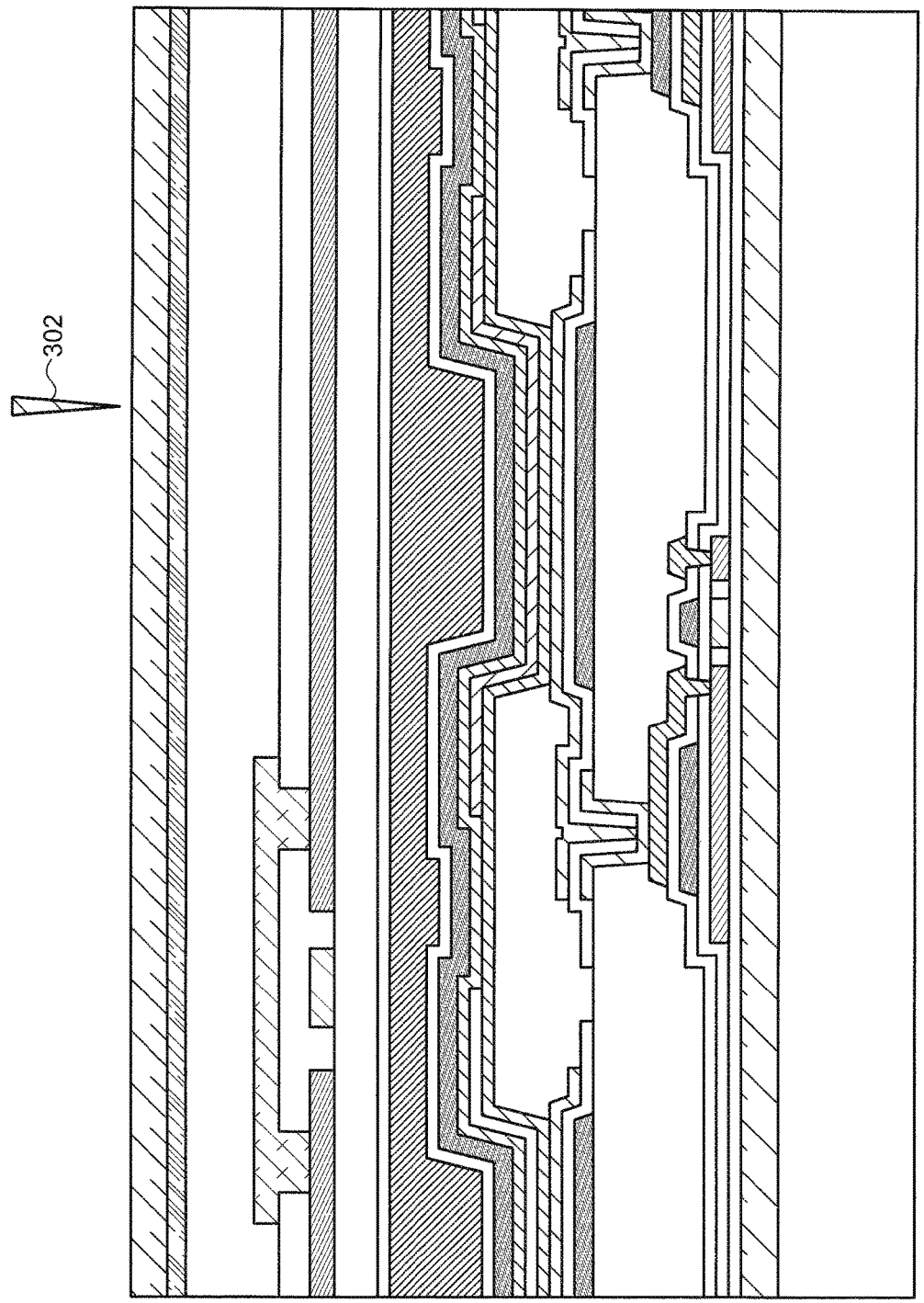
FIG. 23 is a schematic cross-sectional view showing a manufacturing method of a display device according to an embodiment of the present invention.

After that, the second supporting substrate 142 is peeled off. Specifically, light such as laser light is applied from a side of the second supporting substrate 142 to reduce the adhesion between the second supporting substrate 142 and the cap film 112. Then, the cap film 112 is separated from the second supporting substrate 142 using physical force (FIG. 23).

Figure 24:
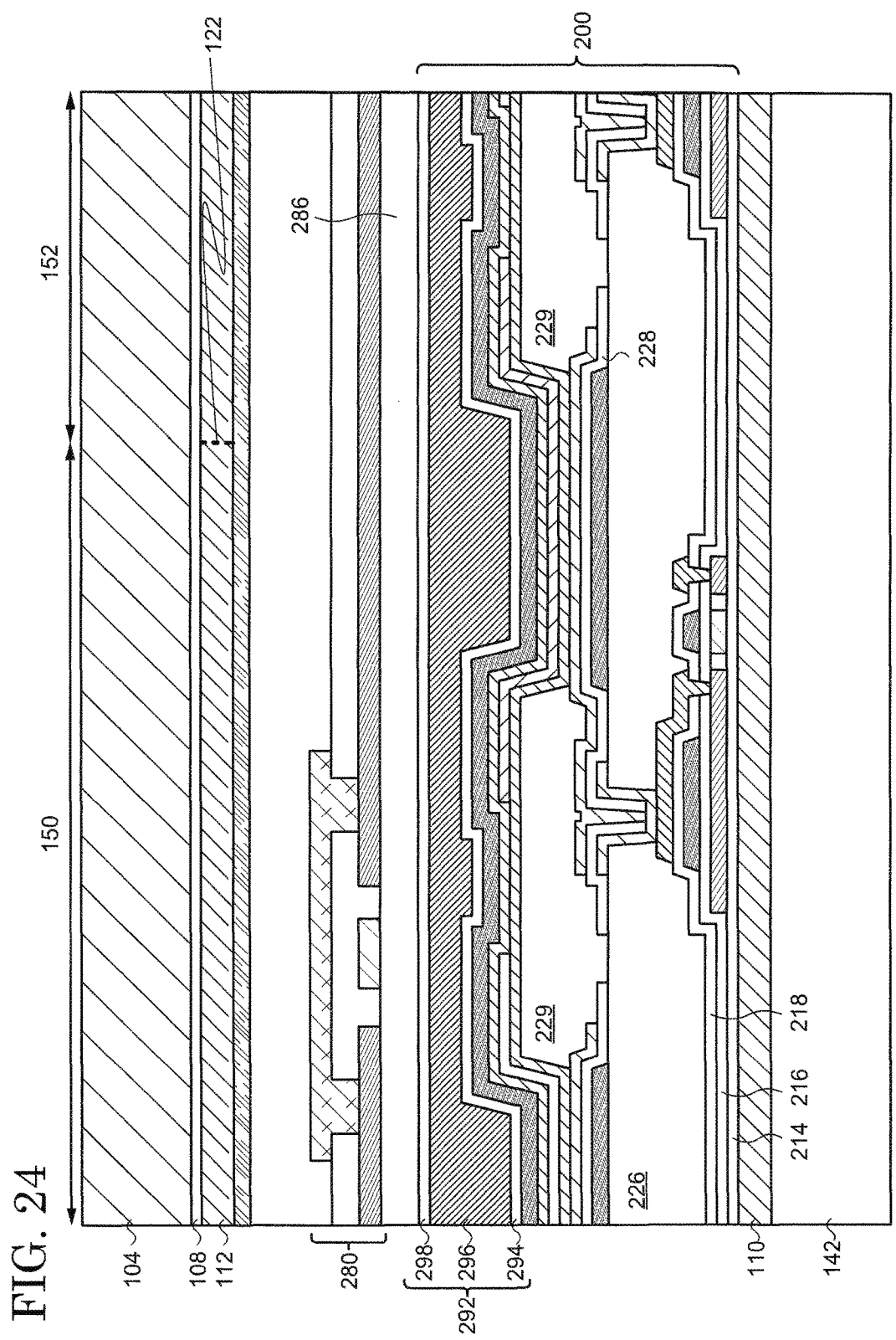
FIG. 24 is a schematic cross-sectional view showing a manufacturing method of a display device according to an embodiment of the present invention.

Next, light such as laser light 302 is applied (FIG. 23) to a position where the gap 122 is to be formed to remove a part of the cap film 112, resulting in the gap 122 (FIG. 24). As the laser light 302, a solid laser such as a ruby laser, an yttrium-aluminum-garnet (YAG) laser, a titanium-sapphire laser, and a semiconductor laser, a liquid laser such as a pigment laser, a gas laser such as a helium-neon laser, an argon-ion laser, a carbon-dioxide laser, a nitrogen laser, an excimer laser, a metal-vapor laser, and a helium-cadmium laser, and the like can be used. Among these lasers, a laser may be selected which has an oscillation wavelength in an absorption wavelength of the cap film 112. The formation of the gap 122 may be carried out by physically removing a part of the cap film 112 with a knife or the like. The gap 122 is formed so as to pass from the top surface to the bottom surface of the cap film 112.

As shown in FIG. 24, the gap 122 may be provided to overlap with the variety of insulating films in the display-element layer 200. For example, the gap 122 can be arranged so as to overlap with the insulating films such as the undercoat 214, the gate insulating film 216, the interlayer film 218, the leveling film 226, the insulating film 222 forming the supplementary capacitor 262, the partition wall 229, the EL layer 274, and each of the layers included in the passivation film 292. Additionally, as shown in FIG. 24, the gap 122 may be formed so as to overlap with the emission region of the light-emitting element 268.

Although not shown, the aforementioned insulating films are also prepared outside the display region 204. For example, the insulating films are formed between the display region 204 and the terminals 210. Therefore, as shown in FIG. 5D, these insulating films are able to overlap with the gap 122 when the gap 122 is formed between the display region 204 and the terminals 210.

As described in the First Embodiment, the gap 122 separates the cap film 112 into the plurality of regions. In the example shown in FIG. 24, the gap 122 separates the cap film 112 into the first region 150 and the second region 152. Thus, the aforementioned insulating films extend over the first region 150 and the second region 152 and overlap with the gap 122. The gap 122 separates the cap film 112 to provide the first cap film 112_1 and the second cap film 112_2 which correspond to the first region 150 and the second region 152, respectively. Therefore, the aforementioned insulating films extend over the first cap film 112_1 and the second cap film 112_2 and overlap with the boundary between the first cap film 112_1 and the second cap film 112_2.

Next, as shown in FIG. 24, the second protection sheet 104 is bonded to the cap film 112 by using the adhesion layer 108. As the adhesion layer 108 and the second protection sheet 104, those described in the First Embodiment can be used.

When the adhesion layer 108 is not used, a polymer usable for the second protection sheet 104 (see the First Embodiment) or a solution or a dispersion of a precursor or an oligomer thereof is applied over the cap film 112, and then a solvent is evaporated. When a polymer is used, the polymer may be cross-linked after being applied onto the cap film. When a precursor is used, a polymer reaction may be conducted after evaporating a solvent. When an oligomer is used, polymerization may be carried out after evaporating a solvent.

Figure 25:
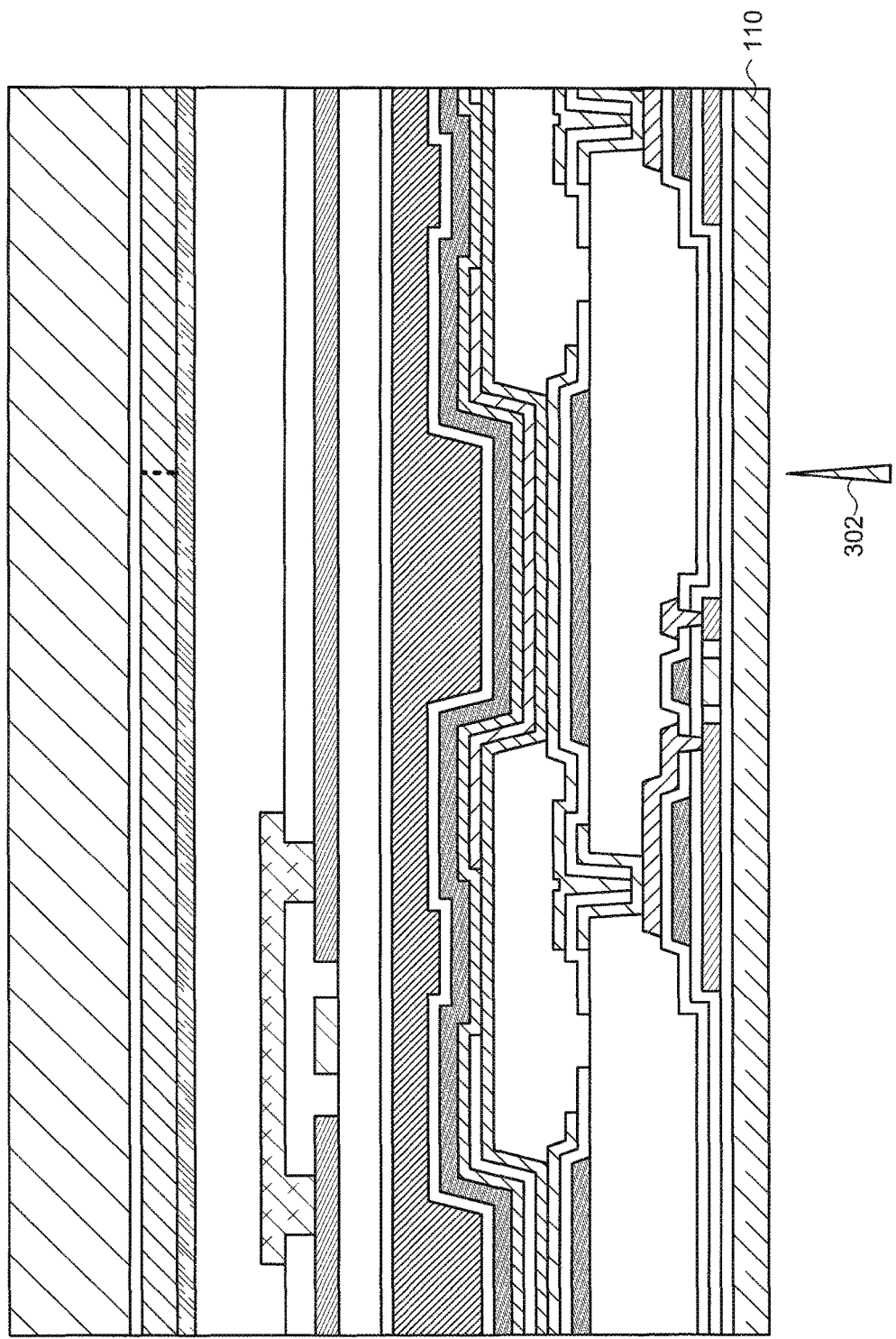
FIG. 25 is a schematic cross-sectional view showing a manufacturing method of a display device according to an embodiment of the present invention.

Next, the gap 120 is formed in the base film 110. Specifically, the second supporting substrate 142 shown in FIG. 24 is separated from the base film 110. This separation may be performed in a similar manner as that of the first supporting substrate 140 from the cap film 112. Furthermore, similar to the formation of the gap 122, the gap 120 is formed by performing light irradiation or physical disconnection on the base film 110 (FIG. 25).

Figure 26:
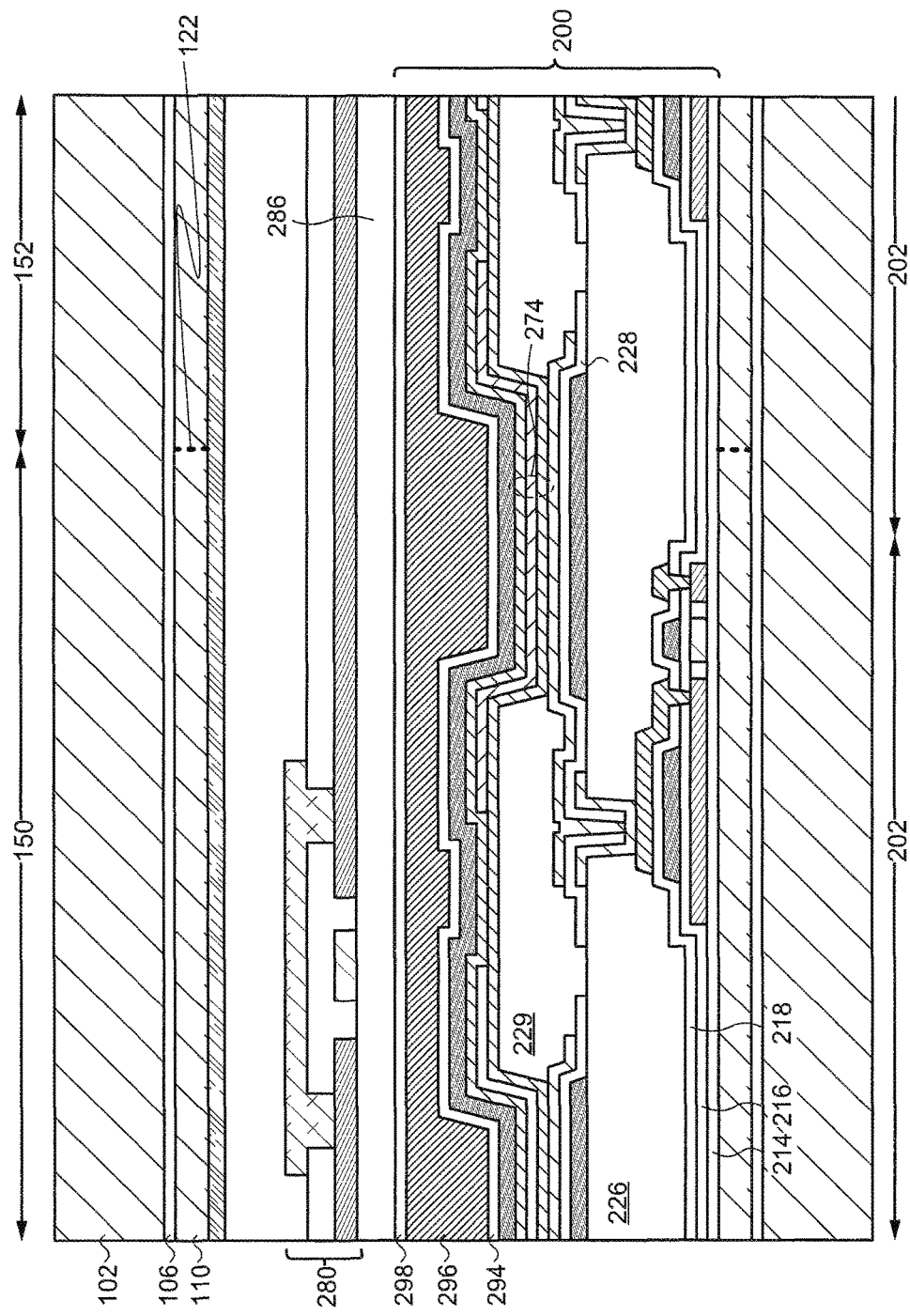
FIG. 26 is a schematic cross-sectional view showing a manufacturing method of a display device according to an embodiment of the present invention.

As shown in FIG. 26, similar to the gap 122, the gap 120 may be provided so as to overlap with the variety of insulating films in the display-element layer 200. For example, the gap 120 may be formed so as to overlap with the insulating films such as the undercoat 214, the gate insulating film 216, the interlayer film 218, the leveling film 226, the insulating film 222 forming the supplementary capacitor 262, the partition wall 229, the EL layer 274, and each of the layers included in the passivation film 292. In addition, as shown in FIG. 26, the gap 120 may be formed so as to overlap with the emission region of the light-emitting element.

Similar to the gap 122, the gap 120 separates the base film 110 into the plurality of regions. In the example shown in FIG. 26, the gap 120 separates the base film 110 into the first region 150 and the second region 152. Thus, the aforementioned insulating films extend over the first region 150 and the second region 152 and overlap with the gap 120. The gap 120 separates the base film 110 to provide the first base film 110_1 and the second base film 112_2 which correspond to the first region 150 and the second region 152, respectively. Therefore, the aforementioned insulating films extend over the first base film 102_1 and the second base film 102_2 and overlap with the boundary between the first base film 110_1 and the second base film 110_2. Moreover, similar to the gap 122, these insulating films may overlap with the gap 120 when the gap 120 is formed between the display region 204 and the terminals 210.

Next, as shown in FIG. 26, the first protection sheet 102 is bonded to the base film 110 with the adhesion layer 106. As the adhesion layer 106 and the first protection sheet 102, those described in the First Embodiment can be used. The first protection sheet 102 can be prepared with the same method as that of the protection sheet 104.

Through the processes described above, the display device 100 can be manufactured. As described in the First Embodiment, both or one of the base film 110 and the cap film 112 are/is provided with the gaps 120 and/or 122, and the first protection sheet 102 and the second protection sheet 104 sandwiching the display-element layer 200, the base film 110, and the cap film 112 have higher elastic limits than the base film 110 and the cap film 112. Therefore, the base film 110, the cap film 112, the first protection sheet 102, and the second protection sheet 104 are not fractured even if the display device 100 is folded at a small curvature, and a flexible display device with high reliability can be produced.

The aforementioned modes described as the embodiments of the present invention can be implemented by appropriately combining with each other as long as no contradiction is caused. Furthermore, any mode which is realized by the persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by the persons ordinarily skilled in the art.

What is claimed is:
1. A display device comprising:
    a base film;
    a display-element layer over the base film, the display-element layer having a display region including a plurality of pixels; and
    a cap film over the display-element layer, wherein
    the base film has a first gap separating the base film into a first region and a second region,
    the cap film has a second gap separating the cap film into a third region and a fourth region,
    the display-element layer comprises an insulating film extending over the first region and the second region and overlapping the first gap, and
    the insulating film extends over a region overlapping with the third region and a region overlapping with the fourth region, and overlaps the second gap.
2. The display device according to claim 1,
    wherein the base film has a bent portion, and
    the first gap is located in the bent portion.
3. The display device according to claim 1, wherein the base film has flexibility.
4. The display device according to claim 1, further comprising a first protection sheet having elasticity under the first region and the second region.

5. The display device according to claim 1, wherein the first gap and the second gap are parallel to and overlap with each other.
6. The display device according to claim 1, further comprising a second protection sheet having elasticity over the third region and the fourth region.
7. The display device according to claim 1, wherein a thickness of the base film and a thickness of the cap film are each equal to or more than 3 µm and equal to or less than 30 µm.
8. The display device according to claim 1,
    wherein the plurality of pixels each comprise a display element including a first electrode,
    the display region comprises a second electrode shared by the plurality of pixels, and
    the second electrode extends over the first region and the second region and overlaps with the first gap.
9. The display device according to claim 1,
    wherein the display-element layer comprises a gate line and a data line intersecting each other and electrically connected to at least one of the plurality of pixels, and
    at least one of the gate line and the data line extends over the second region and the second region and intersects the first gap.
10. A display device comprising:
    a first base film and a second base film separated from each other; and
    a display-element layer over the first base film and the second base film, the display-element layer having a display region including a plurality of pixels, wherein
    the display-element layer comprises an insulating film extending over the first base film and the second base film and overlapping with a boundary between the first base film and the second base film,
    the boundary is located between an edge portion of the first base film and an edge portion of the second base film,
    the edge portion of the first base film and the edge portion of the second base film are bent, and
    the first base film and the second base film overlap with each other.
11. The display device according to claim 10, wherein the first base film and the second base film have flexibility.
12. The display device according to claim 10, further comprising a first protection sheet having elasticity under the first base film and the second base film.
13. The display device according to claim 10, further comprising a first cap film and a second cap film located over the display-element layer and separated from each other, wherein the insulating film extends over a region overlapping with the first cap film and a region overlapping with the second cap film and overlaps with a boundary between the first cap film and the second cap film.
14. The display device according to claim 13, further comprising a second protection sheet having elasticity over the first cap film and the second cap film.
15. The display device according to claim 13, wherein a thickness of the first base film, a thickness of the second base film, a thickness of the first cap film, and a thickness of the second cap film are each equal to or more than 3 µm and equal to or less than 30 µm.
16. The display device according to claim 10,
    wherein the plurality of pixels each comprises a display element including a first electrode,
    the display region has a second electrode shared by the plurality of pixels, and the second electrode extends over a region overlapping with the first base film and a region overlapping with the second base film and overlaps with the boundary between the first base film and the second base film.

17. The display device according to claim 10, wherein the display-element layer comprises a gate line and a data line intersecting each other, the gate line and the data line are electrically connected to at least one of the plurality of pixels, and at least one of the gate line and the data line extends over a region overlapping with the first base film and a region overlapping with the second base film and intersects with the boundary between the first base film and the second base film.

* * * * *